US011265008B2

(12) United States Patent
Alhoshany et al.

(10) Patent No.: US 11,265,008 B2
(45) Date of Patent: Mar. 1, 2022

(54) SUCCESSIVE APPROXIMATION REGISTER (SAR) ANALOG TO DIGITAL CONVERTER (ADC)

(71) Applicant: King Abdullah University of Science and Technology, Thuwal (SA)

(72) Inventors: Abdulaziz Alhoshany, Thuwal (SA); Khaled Nabil Salama, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 17/059,709

(22) PCT Filed: May 29, 2019

(86) PCT No.: PCT/IB2019/054458
§ 371 (c)(1),
(2) Date: Nov. 30, 2020

(87) PCT Pub. No.: WO2019/229678
PCT Pub. Date: Dec. 5, 2019

(65) Prior Publication Data
US 2021/0218411 A1    Jul. 15, 2021

Related U.S. Application Data

(60) Provisional application No. 62/677,849, filed on May 30, 2018, provisional application No. 62/684,972, (Continued)

(51) Int. Cl.
*H03M 3/00* (2006.01)
*H03M 1/46* (2006.01)
*H03M 1/12* (2006.01)

(52) U.S. Cl.
CPC ......... *H03M 1/462* (2013.01); *H03M 1/1245* (2013.01)

(58) Field of Classification Search
CPC ...... H03M 1/468; H03M 1/462; H03M 1/466; H03M 1/38; H03M 1/1009; H03M 1/1245;
(Continued)

(56) References Cited

U.S. PATENT DOCUMENTS

| | | | | |
|---|---|---|---|---|
| 5,235,333 A | * | 8/1993 | Naylor | H03M 1/06 341/118 |
| 6,307,497 B1 | * | 10/2001 | Leung | H03M 1/129 341/139 |

(Continued)

FOREIGN PATENT DOCUMENTS

| | | | | |
|---|---|---|---|---|
| WO | 2017046782 | * | 3/2017 | ............ H03M 1/002 |
| WO | 2017046782 A1 | | 3/2017 | |

OTHER PUBLICATIONS

Shim, et al.,"Edge-Pursuit Comparator: An Energy-Scalable Oscillator Collapse-Based Comparator with Application n a 74.1 dB SNDR and 20 kS/s 15 b SAR ADC", IEEE Journal of Solid-State Circuits, IEEE Service Center, Piscataway, NJ, USA, vol. 52, No. 4, Apr. 1, 2017, 1077-1090. (Year: 2017).*

(Continued)

*Primary Examiner* — Linh V Nguyen
(74) *Attorney, Agent, or Firm* — Billion & Armitage

(57) ABSTRACT

Circuitry and techniques are described herein for performing accurate and low power conversion of an analog value into a digital value. According to some aspects, this disclosure describes a successive approximation register (SAR) analog to digital converter (ADC). According to some aspects the SAR ADC comprises an active integrator between a sample and hold stage and a comparator stage. The active integrator operates differently dependent on whether the SAR ADC is
(Continued)

operated in a sample phase or a conversion phase. According to other aspects, the SAR ADC utilizes a ring oscillator-based comparator to compare a sampled analog input value to a plurality of reference values to determine a digital value representing the analog value.

20 Claims, 21 Drawing Sheets

Related U.S. Application Data filed on Jun. 14, 2018, provisional application No. 62/722,022, filed on Aug. 23, 2018.

(58) Field of Classification Search
CPC .......... H03M 1/46; H03M 1/804; H03M 1/12; H03M 1/08; H03M 1/124; H03M 1/06; H03M 1/00; H03M 1/164; H03M 1/0863; H03M 1/56; H03M 1/68
USPC .................. 341/118, 120, 143, 155, 161, 172
See application file for complete search history.

(56) References Cited

U.S. PATENT DOCUMENTS

| | | | | |
|---|---|---|---|---|
| 6,970,126 | B1* | 11/2005 | O'Dowd ................. | H03M 3/34 341/143 |
| 7,495,589 | B1* | 2/2009 | Trifonov ............. | H03M 1/1019 341/118 |
| 8,581,761 | B1* | 11/2013 | Bahukhandi ........ | H03M 1/0863 341/118 |
| 9,866,227 | B1* | 1/2018 | Bresciani ................ | H03M 1/46 |
| 10,164,653 | B1* | 12/2018 | Kinyua ............... | H03M 1/1042 |
| 10,541,704 | B2* | 1/2020 | Wu .......................... | H03M 1/46 |
| 10,790,842 | B1* | 9/2020 | Paussa .................. | H03M 1/066 |
| 2012/0229204 | A1* | 9/2012 | Han ..................... | H03H 19/004 330/69 |
| 2016/0149586 | A1* | 5/2016 | Roh ...................... | H03M 3/458 341/143 |

OTHER PUBLICATIONS

Search Report and Written Opinion for PCT/IB2019/054458 dated Oct. 10, 2019.
Abdulaziz, et al., "A 45.8fJ/Step, energy-efficient, differential SAR capacitance-to-digital converter for capacitive pressure sensing", Sensors and Actuatores: Physical Elsevier BV, NL, vol. 245, May 3, 2016, 10-18.
Gonen, et al., "15.7 A 1.65mW o.16mm2 dynamic zoon-ADC with 107 .5dB DR in 20kHz", IEEE International Solid-State Circuits Conference (ISSCC), IEEE,, Jan. 31, 2016, 282-283.
Omran, et al., A Robust Parasitic-Insensitive "Successive Approximation Capacitance-to-Digital Converter", Proceedings of the IEEE 2014 Custom Integrated Circuits Conference, IEEE, Sep. 15, 2014, 1-4.
Shim, et al., "Edge-Pursuit Comparator: An Energy-Scalable Oscillator Collapse-Based Comparator with Application in a 74.1 dB SNDR and 20 kS/s 15 b SAR ADC", IEEE Journal of Solid-State Circuits, IEEE Service Center, Piscataway, NJ, USA, vol. 52, No. 4, Apr. 1, 2017, 1077-1090.
Yoshioka, et al., "A 13b SAR ADC with Eye-opening BCO Based Comparator", Proceedings of the ESSCIRC (ESSCIRC), IEEE, Sep. 22, 2014, 411-414.
Chae, et al., "A 6.3 uW 20 bit Incremental Zoom-ADC with 6 ppm INL and 1 uV Offset", IEEE Journal of Solid-State Circuits, vol. 48, No. 12, Dec. 1, 2013, 3019-3027.

Chae, et al., "Low Voltage, Lo Power, Inverter-Based Switched-Capacitor Delta-Signma Modulator", IEEE Journal of Solid-State Circuits, vol. 44, No. 2, Feb. 2009, 458-472.
"Capacitive Pressure Sensors", Innovations in Microsystem Technologies, Nov. 1, 2014, 1-2.
Alhoshany, et al., "A 45.8 fJ/Step, energy-efficient, differential SAR capacitance-to-digital converter for capacitive pressure sensing", Sensors and Actuators A 245 10-18, Jan. 1, 2016.
Chen, et al., "A 9.35-ENOB, 14.8 fJ/conv.-step Fully-Passive Noise-Shaping SAR ADC", Tokyo Institute of Technology, Jun. 28, 2021, 2.
Fredenburg, et al., "A 90-MS/s 11-MHz-Bandwidth 62-dB SNDR Noise-Shaping SAR ADC", IEEE Journal of Solid-State Circuits, vol. 47, No. 12,, Dec. 1, 2012.
Guo, "A 12b-ENOB 61UW Noise-Shaping SAR ADS with a Passive Integrator", Department of Electrical and Computer Engineering, Jun. 28, 2021, 405-408.
Ha, et al., "A 160nW 63.9fJ/conversion-step Capacitance-to- Digital Converter for Ultra-Low-Power Wireless Sensor Nodes", ISSCC 2014 / SESSION 12 / Sensors, MEMS, and Displays / 12.6, Feb. 11, 2014, 220-222.
He, et al., "A 0.05mm2 1V Capacitance-to-Digital Converter Based on Period Modulation", ISSCC 2015 / Session 27 / Physical Sensors / 27.7, Feb. 25, 2015, 486-488.
Jung, et al., "A 0.7pF-to-10nF Fully Digital Capacitance-to-Digital Converter Using Iterative Delay-Chain Discharge", ISSCC 2015 / SESSION 27 / Physical Sensors / 27.6, Feb. 25, 2015.
Oh, et al., "15.4b Incermental Sigma-Delta Capacitance-to-Digital Converter with Zoom-in 9b Asynchronous SAR", Symposium on VLSI Circuits Digest of Technical Papers, Jan. 1, 2014.
Oh, et al., "A Dual-Slope Capacitance-to-Digital Converter Integrated in an Implantable Pressure-Sensing System", IEEE Journal of Solid-State Circuits, vol. 50, No. 7,, Jul. 1, 2015.
Omran, et al., "7.9 pJ/Step Energy-Efficient Multi-Slope 13-bit Capacitance-to-Digital Converter", IEEE Transactions on Circuits and Systems—II: Express Briefs, vol. 61, No. 8,, Aug. 1, 2014.
Omran, et al., "A 33fJ/Step SAR Capacitance-to-Digital Converter Using a Chain of Inverter-Based Amplifiers", IEEE Transactions on Circuits and Systems-I: Regular Papers, vol. 64, No. 2,, Feb. 1, 2017.
Sanjurjo, "An Energy-Efficient 17-bit Noise-Shaping Dual-Slope Capacitance-to-Digital Converter for MEMS Sensors", Marie Curie project SIMIC, Grant Agreement No. 610484, funded by grants from the European Union (Research Executive Agency) and TEC201016330 of CICYT, Spain., Jan. 1, 2016, 389-392.
Sanyal, et al., "A 55fJ/conv-step Hybrid SAR-VCO !? Capacitance-to-Digital Converter in 40nm CMOS", TSMC Shuttle Program for Chip Fabrication, Jun. 28, 2021, 385-388.
Shim, et al., "An Oscillator Collapse-Based Comparator with Application in a 74.1dB SNDR, 20KS/s 15b SAR ADC", Symposium on VLSI Circuits Digest of Technical Papers, Jan. 1, 2016.
Shu, et al., "An Oversampling SAR ADC With DAC Mismatch Error Shaping Achieving 105 dB SFDR and 101 dB SNDR Over 1 kHz BW in 55 nm CMOS", IEEE Journal of Solid-State Circuits, vol. 51, No. 12,, Dec. 1, 2016, 2928-2940.
Tan, et al., "A 1.2-V 8.3-nJ CMOS Humidity Sensor for RFID Applications", IEEE Journal of Solid-State Circuits, vol. 48, No. 10,, Oct. 1, 2013, 2469-2477.
Tan, et al., "An Energy-Efficient 15-Bit Capacitive-Sensor Interface Based on Period Modulation", IEEE Journal of Solid-State Circuits, vol. 47, No. 7,, Jul. 1, 2012, 1703-1711.
Tanaka, et al., "A 0.026mm2 Capacitance-to-Digital Converter for Biotelemetry Applications Using a Charge Redistribution Technique", IEEE Asian Solid-State Circuits Conference, Nov. 12, 2007.
Xia, et al., "A Capacitance-to-Digital Converter for Displacement Sensing with 17b Resolution and 20μs Conversion Time", ISSCC 2012 / Session 11 / Sensors & MEMS / 11.2, Feb. 21, 2012, 198-200.

* cited by examiner

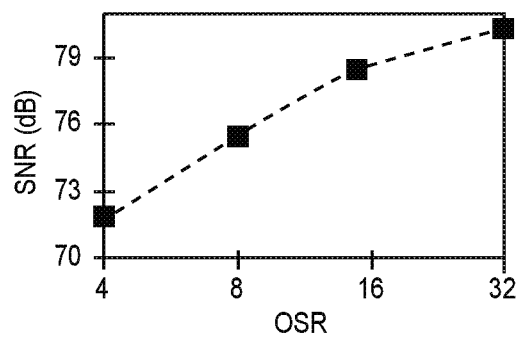
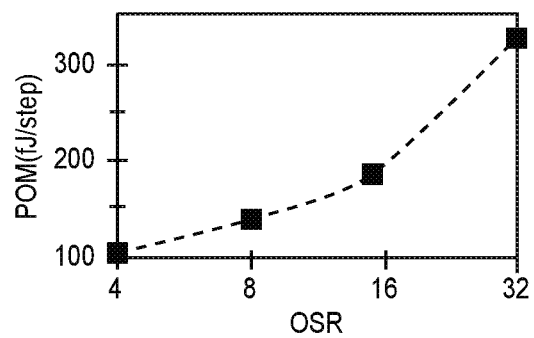
FIG. 12C  FIG. 12D

PERFORMANCE SUMMARY OF THE PROTOTYPE CDC

| Technology | 0.18 μm CMOS |
|---|---|
| Supply (Analog/Digital) | 0.8 V / 1 V |
| Capacitance Range | 3.6 pF |
| Power (Analog) | 1.02 μW |
| Power (Digital) | 0.39 μW |
| Power ($V_{REF}$) | 0.18 μW |
| Sampling Clock | 18.51 KS/s |

FIG. 15A

COMPARISON WITH STATE-OF-THE-ART CDCs

| Reference | ISSCC 2012 [10] | ISSC 2013 [11] | ISSC 2015 [13] | ISSCC 2015 [20] | ESSCIRC 2016 [18] | VLSI 2014 [22] | ESSCIRC 2016 [24] | S&A 2016 [27] | ISSC 2017 [12] | This Work |
|---|---|---|---|---|---|---|---|---|---|---|
| Architecture | $\Delta\Sigma$ | $\Delta\Sigma$ | Dust Slope | PM | IDS+ADC | SAR + $\Delta\Sigma$ | SAR+VCO | SAR | SAR | NS-SAR |
| Differential | Yes | Yes | No | No | Yes | No | No | Yes | No | Yes |
| Technology ($\mu$m) | 0.35 | 0.16 | 0.18 | 0.16 | 0.13 | 0.18 | 0.04 | 0.18 | 0.18 | 0.18 |
| Supply (V) | 3.3 | 1.2 | 0.6/1.2 | 1 | 1.5 | 1.4 | 1 | 0.9/1 | 1 | 0.8/1 |
| Area (mm$^2$) | 2.6 | 0.28 | 0.105 | 0.05[a,b] | 0.317 | 0.456 | 0.034 | 0.1 | N/A | 0.3 |
| Resolution (rms) | 65aF | 70aF | 8.7fF | 14fF | 5.4aF | 160aF | 1.1fF | 1.3fF | 4.75fF | 150aF |
| Meas. Time (ms) | 0.02 | 0.8 | 6.4 | 0.21 | 100 | 0.23 | 0.001 | 0.0425 | 16.66 | 0.81 |
| Power ($\mu$W) | 14850 | 10.3 | 7 | 14[a] | 220 | 33.7 | 75 | 3.84 | 0.13 | 1.59 |
| ENOB [c] (Bits) | 13.8 | 11.1 | 7 | 10.6 | 15.7 | 15.4 | 10.4 | 11.8 | 9.2 | 12.74 |
| SNR (dB) | 84.8 | 68.5 | 44.2 | 65.5 | 96.3 | 94.7 | 64.2 | 72.7 | 57.1 | 78.5 |
| FoM (fJ/Step) | 20823 | 3754 | 5300 | 1870[a] | 413287 | 175 | 55 | 46 | 3900 | 187 |

[a] Power consumption and area of time-to-digital converter are not included.
[b] Off chip reference capacitor is employed.
[c] ENOB = (SNR-1.76/6.02.

FIG. 15B

SUCCESSIVE APPROXIMATION REGISTER (SAR) ANALOG TO DIGITAL CONVERTER (ADC)

CROSS-REFERENCE TO RELATED APPLICATION(S)

This application is a National Stage Application of PCT/IB2019/054458, filed on May 29, 2019, and claims the benefit of and priority to U.S. Provisional Application No. 62/677,849, filed May 30, 2018, U.S. Provisional Application No. 62/684,972 filed Jun. 14, 2018, and U.S. Provisional Application No. 62/722,022 filed Aug. 23, 2018, each of which are incorporated by reference herein.

TECHNICAL FIELD

The present disclosure is related generally to analog to digital conversion, and in particular, to analog to digital conversion using successive approximation techniques.

BACKGROUND

In many electrical applications, it is desirable to convert analog values to digital values, so that the values may be processed, stored, and/or communicated in a digital format. One area in which digital conversion is desirable is sensor systems. In such systems, sensors output a analog values representing a sensed value. Many sensor systems or devices employ one or more components configured to digitize an analog sensor output signal, such as an analog to digital converter (ADC).

In some applications, is desirable to minimize an amount of power consumed to operate a sensor system. For example, in applications where a sensor or sensor device(s) operate based on a limited energy source (e.g., a battery, harvested energy), it is typically desirable to reduce power consumption so that the device(s) operate as long as possible.

In some cases, an ADC consumes a significant amount of energy relative to other components of a sensor device or system. As such, a need exists for improvements in ADC circuitry and techniques that offer high performance with low energy consumption for limited energy applications.

SUMMARY

According to some embodiments, a successive-approximation register (SAR) analog to digital converter (ADC) includes a sample and hold stage, a SAR controller, a digital to analog converter (DAC) stage, a comparator stage, and an active integrator stage. The sample and hold stage comprises at least one sense capacitor and is configured to receive a differential analog input value. The SAR controller sequentially generates a plurality of digital codes representing a plurality of reference values. The DAC stage converts the plurality of digital codes into a plurality of analog reference voltages representing the plurality of reference values. The comparator stage compares the input value to the plurality of reference voltages. The active integrator stage is coupled between the sample and hold stage and the comparator stage, wherein the SAR controller generates a digital value corresponding to the analog input value based on an output of the comparator.

According to some embodiments, a method of converting an analog sensor signal to a digital value includes receiving an analog input value. The method further includes sequentially generating a plurality of digital codes representing a plurality of reference values and converting the plurality of digital codes into a plurality of reference voltages representing the plurality of reference values. The method further includes actively integrating one or more of the analog input value and the plurality of reference voltages. The method further includes comparing the analog input value to each of the plurality of reference voltages and generating, based on the comparing, a digital value corresponding to the analog input value.

According to some embodiments, a successive-approximation register (SAR) analog to digital converter (ADC) includes means for receiving an analog input value. The SAR ADC further includes means for sequentially generating a plurality of digital codes representing a plurality of reference values and means for converting the plurality of digital codes into a plurality of reference voltages representing the plurality of reference values. The SAR ADC further includes means for actively integrating one or more of the analog input value and the plurality of reference voltages. The SAR ADC further includes means for comparing the analog input value to each of the plurality of reference voltages and means for generating, based on the comparing, a digital value corresponding to the analog input value.

BRIEF DESCRIPTION OF THE DRAWINGS

FIG. 12C is a graph that shows a measured signal to noise ratio consistent with one or more aspects of this disclosure.

FIG. 12D is a graph that shows an measured figure of merit consistent with one or more aspects of this disclosure.

FIG. 15A is a table depicting a performance summary of a SAR ADC

FIG. 15B is a table depicting a comparison of the SAR ADC described herein to other topologies for performing capacitance to digital conversion consistent with one or more aspects of this disclosure.

DETAILED DESCRIPTION

Figure 1:
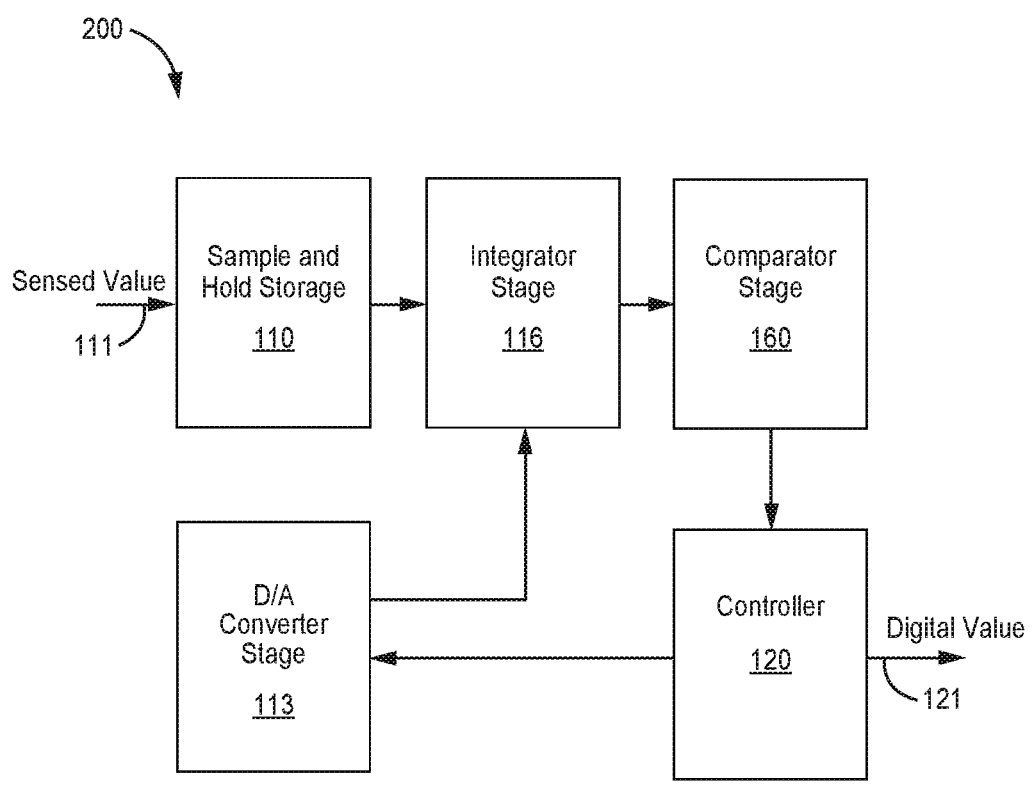
FIG. 1 is a block diagram depicting one example of a successive approximation register (SAR) analog to digital converter (ADC) consistent with one or more aspects of this disclosure.

In some examples, sensor applications utilize sensors that operate based on limited power source such as a battery or harvested energy. For a such applications, it is desirable for sensor(s), and the electrical circuitry or devices that read and/or process sensor output, to operate using little energy as possible. As non-limiting examples, it may be desirable to use low energy consumption sensors for gas sensing, DNA analysis, monitoring of bacteria/cell growth, protein detection, displacement sensing, humidity sensing, and pressure sensing.

In some examples, capacitive sensors are used in energy-constrained applications, as they do not consume static power and can be used in wide range of applications to measure different physical, chemical or biological quantities. In some instances, an interface circuit that digitizes an analog output of a capacitive sensor (e.g., an analog to digital converter) may consume a disproportionate amount of energy relative to other components of a sensor device or system. As such, it may be particularly desirable to minimize energy consumption of digitizing interface circuits.

Several different types of capacitance-to-digital converters (CDC) are available that are suitable to perform conversion of capacitive sensor output to a digital value readable by digital processing circuitry. A CDC converts a capacitance output by a sensor to an analog voltage, and performs a low-power analog-to-digital conversion of the analog voltage. Some CDC designs include signal conditioning and a buffer, which increase both the complexity and power consumption of the CDC architecture. According to other CDC designs, a sensor capacitance is digitized directly by physically integrating the capacitive sensor into the ADC (i.e., in the same integrated circuit or package). According to these examples, high capacitive resolution was achieved by using sigma-delta modulators.

Other CDC designs use a switched capacitor (SC) integrator. According to these designs, many cycles of charging and discharging of the capacitive sensor are required to produce a digital output, which may degrade energy efficiency of the CDC. Still other CDC designs utilize period modulation. According to these examples, a capacitance output from a sensor is converted to time by an integration circuit, and then digitized by a digital counter. However, these designs require a high-frequency stable clock to achieve high resolution, which increases power consumption.

Some CDC designs use a successive approximation (SAR) technique to convert sensor output into digital values. According these designs, a capacitive sensor is connected to a capacitive digital-to-analog converter (DAC) of the SAR ADC. These designs achieve high energy efficiency, however they do not offer high capacitive resolution and suffer from limited resolution and parasitic-dependent conversion errors.

A SAR ADC receives an analog sensor input value and converts the sensor input value into a digital value. A SAR ADC controller sequentially generates a plurality of digital codes that each represent a reference value. A digital-to-analog converter (DAC) converts the digital codes into analog reference voltages. A comparator compares each analog reference value to the analog sensor input value, and sets a bit of an output digital value that represents the analog sensor input value based on the comparison. Once the SAR ADC completes the comparisons and sets each bit of the output digital value, the digital value is output as a representation of the analog sensor input value.

A differential SAR ADC includes a sense capacitor $C_{SENS}$ and a reference capacitor $C_{REF}$ associated with the DAC, which may be implemented using a binary-weighted capacitive DAC. A SAR ADC may have a parasitic capacitance $C_P$ representing parasitic capacitances caused by the sensor or non-ideal behavior of circuit components.

A differential SAR ADC consists of two halves that are excited differentially, and it operates in two phases: sampling phase and conversion phase. During the sampling phase, the capacitive DAC is switched to ground in the first half of the circuit, and the second half is switched to reference voltage $V_{REF}$ in the second half to store the charge. The capacitive sensors are switched between ground and $V_{REF}$ so that a fully differential charge is generated proportional to the sensor capacitance. In the conversion phase, the differential input voltage of the comparator is given by, $$\Delta V = 2V_{REF} \frac{(C_{SENS} - C_{REF})}{C_T} + V_{OS} \quad (1)$$

where $C_T$ is the total capacitance, i.e., $C_T=(C_{SENS}+C_{REF}+C_P)$, and $V_{OS}$ is the offset voltage of the comparator. Based on the comparator output, the SAR logic modifies $C_{REF}$ until it matches $C_{SENS}$ within the resolution of the capacitive DAC. The least significant bit (LSB) can be expressed as, $$LSB = \frac{C_T V_{OS}}{2V_{REF}}. \quad (2)$$

Parasitic capacitances on-chip and off-chip may not be stable. Therefore, the offset voltage $V_{os}$ of the comparator may result in parasitic-dependent conversion errors, which limit the achievable resolution.

On the other hand, hybrid (two-step) SAR CDC architectures achieve high resolution and energy efficiency. According to such architectures, the SAR CDC performs a coarse conversion, and a residue voltage is quantized by a sigma delta ($\Delta\Sigma$) ADC, or by a ring voltage-controlled oscillator (VCO) $\Delta\Sigma$ in the time domain. These differential SAR CDC architectures are still sensitive to parasitic capacitances at the input of the comparator that effect the residue voltage.

This disclosure is directed to electrical circuits and techniques for performing capacitive to digital conversion (CDC) using a SAR ADC circuit topology to provide for high performance (e.g., high capacitive resolution) and low power in comparison to other techniques. According to some aspects, CDC conversion as described here combines noise-shaping with a SAR ADC topology and operation.

The SAR ADC described herein provides significant improvements over other types of circuitry that perform capacitive to digital conversion, such as reduced power consumption, improved resolution, and improved immunity to parasitics.

According to some aspects, a SAR ADC is described that includes an integrator stage between a sense capacitor and a comparator used to compare the reference value(s) to the analog sensor input value. In some examples, the integrator stage includes an operational transconductance amplifier (OTA), that may be inverter-based.

According to other aspects, an ADC as described herein includes an active integrator stage with a feedback capacitor. The ADC operates in a first phase to acquire a sample analog input value, and a second phase to convert the sampled analog input value into a digital output value. In the first phase, the amplifier is operated as a unity gain amplifier by removing the feedback capacitor from a feedback loop of the amplifier. In the second phase, the amplifier is operated as a charge amplifier by including the feedback capacitor in the feedback loop of the amplifier.

According to other aspects of this disclosure, a SAR ADC is described herein that utilizes a ring oscillator-based comparator to compare a sensed analog input with sequentially generated reference values. According to still other aspects, a SAR ADC as described herein is a differential ADC configured to digitize a differential analog signal to generate a digital output value.

A SAR ADC as described herein offers significant benefits in comparison to other techniques and circuitry for performing low-power digitization of an analog sensor input value. For example, the ADC may tolerate large parasitic capacitances and offer robustness against common mode noise, noise coupling and errors. In addition, the ADC overcomes the parasitic-dependent conversion errors, offering improved robustness and insensitivity to parasitic capacitances in comparison with other ADCs. In some examples, the described ADC achieves an absolute resolution of 150 attofahrrads (aF) and an energy-efficiency FoM of 187 fJ/conversion-step.

FIG. 1 is a block diagram that illustrates one example of a successive approximation register (SAR) ADC 100 consistent with one or more aspects of this disclosure. As shown in FIG. 1, SAR ADC 100 includes an input 111 and an output 121. ADC 100 operates to convert an analog value received at input 111, and generate a digital output value that represents the analog value at output 121. The digital value at output 121 may be useable by digital processing circuitry, stored, communicated, or otherwise used. For example, where the input analog value comes from an operating sensor, the digital value at output 121 may be provided to digital processing circuitry to analyze data from the sensor.

ADC 100 includes a digital to analog (D/A) converter stage 113, a comparator stage 160, and a controller 120. In operation, to convert a received analog input value (e.g., a received voltage level or capacitance), sample and hold stage receives the sample in a first phase, and in a conversion stage, holds the received sample for conversion into a digital output value.

During the conversion stage of ADC 100, when a sample is held by sample and hold stage 110 for conversion, controller 120 generates a plurality of digital codes that represent reference values. Controller 120 provides the digital codes to D/A converter stage 113, which converts each digital code to an analog representation of the reference value.

Comparator stage 160 compares the "held" analog input value received at input 111 to each of the reference values, and outputs an indication of each comparison to controller 120.

Dependent on an output of comparator stage 160 for each comparison, controller 120 sets a bit, with a value of 0 or 1, of an output digital value that represent the sampled analog input value received at input 111. As comparator stage 160 provides a result of comparing the analog input value to each respective reference value, controller 120 continues to sequentially set each bit of the output digital value until all bits of the digital value are set. In this manner, ADC 100 performs a scan of the sampled input value to the generated plurality of reference values until a "match" has been found. Once a "match" has been found by controller 120, controller 120 outputs the digital value at output 121.

As also shown in FIG. 1, ADC 100 includes an integrator stage 116 coupled between sample and hold stage 110 and comparator stage 160. Integrator stage 116 integrates the analog input value and/or the analog reference values generated by D/A converter stage 113 to improve performance of ADC 100 in comparison to other CDC designs. In some examples, integrator stage 116 may include an operational transconductance (OTA) amplifier. In some examples, the OTA amplifier is an inverter-based OTA amplifier.

In some examples, integrator stage 116 is an active integrator in the sense that it is operated differently according to different phases of ADC 100. For example, in a first phase (e.g., the sample phase of ADC 100), integrator stage 116 is operated as a unity gain amplifier, and in a second stage (e.g., the conversion phase of ADC 100), integrator stage 116 is operated as a charge amplifier.

In some examples, the amplifier of inverter stage 116 includes a first feedback loop and a second feedback loop. According to these examples, in the first phase, the first feedback loop is enabled, causing the amplifier to operate as a unity gain amplifier. In a second phase, the second feedback loop is enabled, causing the amplifier to operate as a charge amplifier. In some examples, the second feedback loop includes a feedback capacitor, and when the second loop is enabled, the feedback capacitor is included in the feedback loop of the amplifier to cause the amplifier to operate as a charge amplifier.

In some examples, comparator stage 160 includes a ring oscillator-based comparator stage. In some examples, ADC 100 is configured to operate as a single-ended ADC configured to receive a single-ended input voltage and generate an output digital value based on the single-ended input voltage.

In other examples, ADC 100 is configured to operate as a differential ADC configured to receive a differential input voltage and generate an output digital value based on the differential input voltage.

ADC 100 depicted in FIG. 1 offers significant benefits in comparison to other techniques and circuitry for performing low-power digitization of an analog sensor input value. For example, ADC 100 may tolerate large parasitic capacitances. According to other aspects, the ADC 100 offers robustness against common mode noise, noise coupling and errors. In addition, ADC 100 overcomes parasitic-dependent conversion errors, offering improved robustness and insensitivity to parasitic capacitances in comparison with other ADCs. In some examples, ADC 100 achieves an absolute resolution of 150 attofahrrads (aF) and an energy-efficiency figure of merit (FoM) of 187 fJ/conversion-step.

Figure 2:
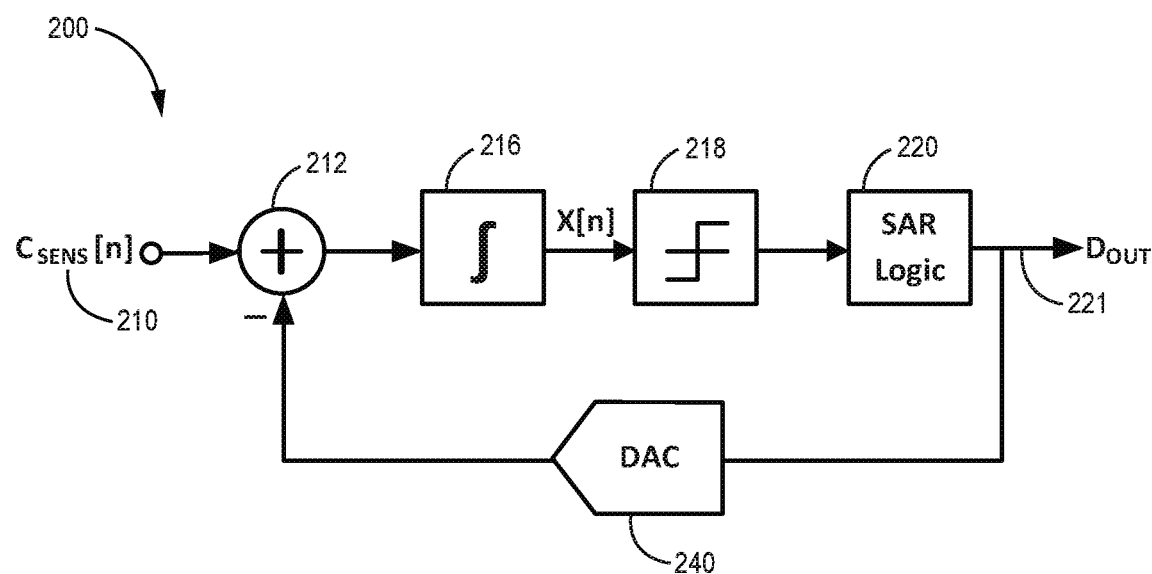
FIG. 2 is a conceptual diagram illustrating a SAR ADC consistent with one or more aspects of this disclosure.

FIG. 2 is a conceptual diagram illustrating one example of a SAR ADC 200 consistent with one or more aspects of this disclosure. As depicted in FIG. 2, the SAR ADC includes a sense input 210, a summing node 212, an integrator stage 216 comparator stage 218, a successive approximation register (SAR) logic stage 220, a digital to analog (D/A) converter stage 240, and an output Dout 221.

As shown in FIG. 2, SAR ADC 200 includes integrator stage 216 inserted between a comparator stage 218 and DAC stage 240 to address the limitations of the other SAR CDCs. As described herein, a parasitic capacitance of ADC 200 is connected to a virtual ground node of the integrator stage 216 so that it will not affect operation. Also, an error feedback scheme can be applied when the integrator is not reset every clock cycle, so the error is stored at the output of the integrator stage 216. ADC 200 depicted in FIG. 2 is based on charge-redistribution successive-approximation with noise shaping.

Figure 3:
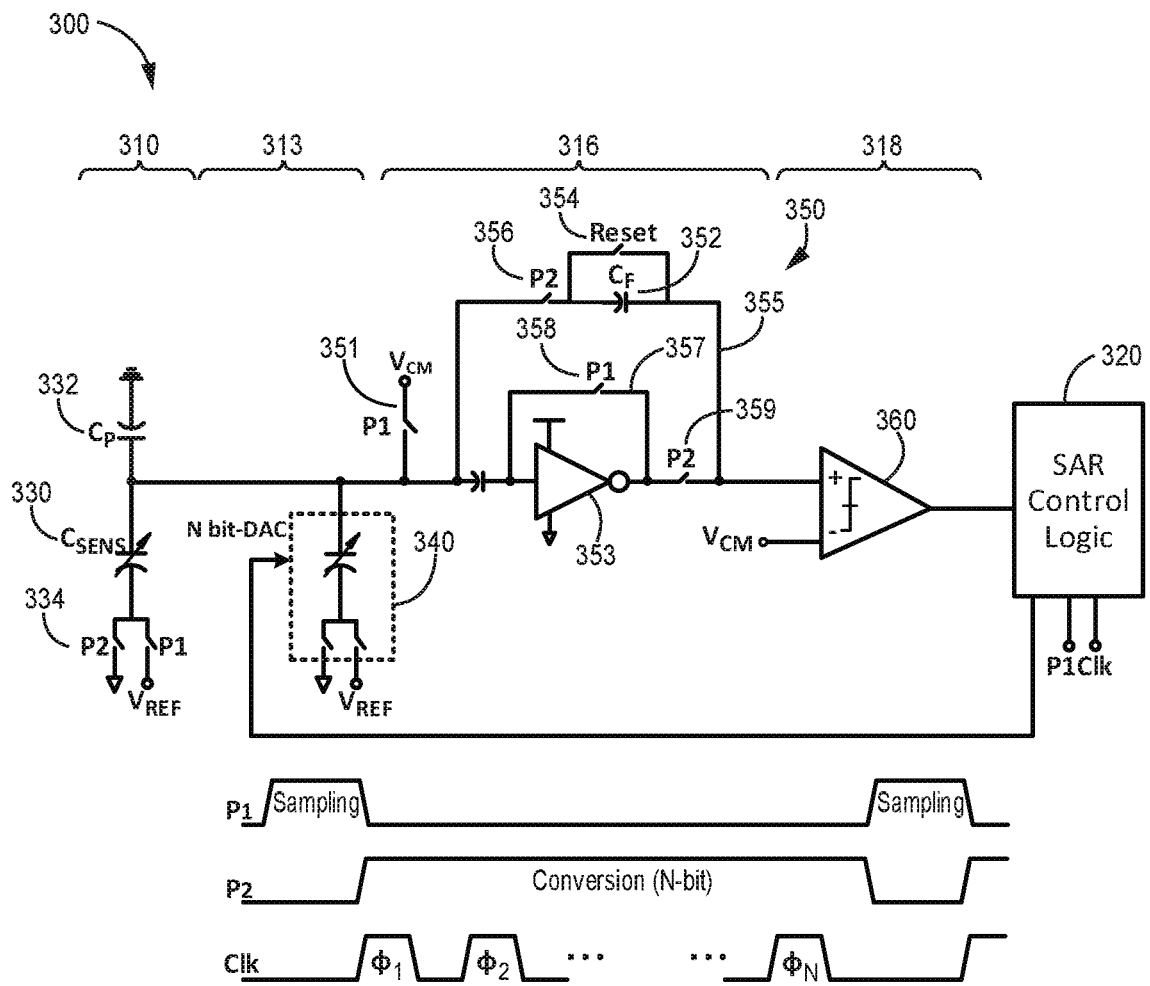
FIG. 3 is a circuit diagram illustrating one example of a SAR ADC consistent with one or more aspects of this disclosure.

FIG. 3 is a circuit diagram depicting one example of a SAR ADC 300 consistent with one or more aspects of this disclosure. The example of FIG. 3 depicts an ADC 300 configured to operate based on a single-ended input value. As shown in FIG. 3, SAR ADC 300 includes a sense and hold stage 310, a digital to analog (D/A) converter stage 313, an integrator stage 316, a comparator stage 318, and a SAR controller 320.

ADC 300 depicted in FIG. 3 includes various switch elements labeled with "P1" and "P2." The labels P1 and P2 refer to a state of the respective switch relative to the respective sample and conversion phases of ADC 300. For those switches labeled P1, the switch is held closed in the sample phase P1, and opened in the conversion phase P2. Likewise, those switches labeled P2 are closed during the conversion phase P2, and opened during the sampling phase P1.

According to the example of FIG. 3, sample and hold stage 310 include a sense capacitor 330 with a first end coupled to ground (via representative of parasitic capacitance $C_p$ 332), and a second end coupled to switches 334. During a sample phase P1, sense capacitor 330 is coupled to a reference voltage $V_{ref}$, which may be a common mode voltage of ADC 300. During a conversion phase P2, sense capacitor is coupled to ground.

As also shown in FIG. 3, ADC 300 includes D/A converter stage 313, which includes a converter 340 including a reference capacitor and a plurality of switches coupled between the reference capacitor and ground, and the reference capacitor and a reference voltage $V_{ref}$. In some examples, D/A converter stage 313 includes a plurality of capacitors, each associated with a pair of switches as depicted in FIG. 3. In operation, based on digital codes received from controller 320, D/A converter stage 313 outputs analog values (e.g., a voltage) representing the digital codes.

During the conversion phase, an output of D/A converter stage 313 is combined with (added to or subtracted from) the input value held across sense capacitor 330 to make a difference value between the analog reference value and the analog input value. The difference value is input to integrator stage 316, which operates to integrate the difference value. As shown in FIG. 3, an output of integrator stage 316, an integrated difference value, is input to a positive terminal of comparator 360, and a reference voltage (e.g., a common mode voltage $V_{cm}$ of ADC 300) is input into a negative terminal of comparator 360. Comparator 360 compares the integrated difference value from integrator stage 316 with the reference value ($V_{cm}$). Controller 320 sets bits of a digital value representing the analog input value based on the outputs of comparator 360.

In some examples, integrator 350 of integrator stage 360 may be described as an active integrator, because integrator 350 operates differently depending on whether ADC 300 is operating in a first phase (a sample phase P1) or a second phase (a conversion phase P2).

As shown in FIG. 3, integrator stage 316 includes a first feedback loop 357 and a second feedback loop 355. The second feedback loop 355 includes a feedback capacitor $C_f$ 352, while the first feedback loop 357 does not include a feedback capacitor.

When in a sample phase, switches P2 of integrator stage 316 are opened, while switches P1 of integrator stage 316 are closed. In the sample phase P1, an input node of integrator stage 316 is coupled to the common mode voltage $V_{cm}$ via switch 351, and first feedback loop 357 is enabled via the switch 358 and second feedback loop 355 is disabled via switch 356, thereby causing integrator 350 to operate as a unity gain amplifier. In addition, in the sample phase P1, an output of amplifier 353 is disconnected from the positive terminal of comparator 360 via switch 359.

As described above, integrator 350 operates differently in the conversion phase. In the conversion phase, switch 359 is closed, thereby coupling an output of amplifier 353 to the positive terminal of comparator 360. Also, first feedback loop 357 is disabled via switch 358, and second feedback loop 355 is disabled via switch 356. Accordingly, feedback capacitor $C_f$ 352 is added to the feedback of amplifier 353, thereby causing integrator 350 to operate as a charge amplifier. In this manner, integrator stage 316 is configured to operate differently depending on a phase of ADC 300.

As also depicted in FIG. 3, integrator stage 316 includes a reset switch 354 coupled in parallel across feedback capacitor 352. In some examples, when the integrator stage 316 is reset, residue information of a previous cycle that is stored in the integrator stage 316 is fed back to the current sampled input of the ADC 300 (e.g., sense capacitor 330) before a next conversion begins. Accordingly, noise shaping is realized by integrator stage 316.

The architecture depicted in FIG. 3 can be used in one of two operation modes. According to a first mode, the integrator is reset (via switch 354) for every conversion. In this mode, ADC 300 provides moderate resolution and can tolerate large parasitic capacitance. According to a second mode, integrator stage 316 is reset based on a number of cycles number of clock cycles. As an example, integrator stage 316 is reset using an oversampling ratio (OSR) to accumulate the error. In one such example where OSR equals 1, integrator stage operates in the first mode, resetting every clock cycle. In other examples, according to the second mode, integrator stage 316 is reset after generating a predetermined number of output samples. According to such examples, OSR has a value different than 1. In some examples, controller 320 includes a counter, and resets integrator stage 316 when a value of the counter has exceeded a predetermined threshold value. In the second mode, ADC 300 may exhibit higher resolution and/or higher capacitive resolution. In this manner, ADC 300 described herein combines the merits of noise shaping with other benefits of operation of a SAR ADC.

Although not depicted in FIG. 3, amplifier 353 may comprise an operational transconductance amplifier (OTA) which may be an inverter-based OTA in some examples. In other examples, other types of amplifier topologies may be employed to integrate signals before the signals are provided to comparator 360. In some examples, comparator 360 includes a ring oscillator-based comparator, however in other examples comparator 360 may include any other type of comparator configured to compare two values and output an indication of which is higher or lower. In the example of FIG. 3, digital to analog converter (DAC) 340 is depicted as a binary weighted capacitive DAC including a capacitor and two switches, however any DAC topology configured to receive digital codes from controller 320 and output an analog value representing the received digital codes may be used. Furthermore, in some examples, DAC 340 may include a plurality of capacitors that are each used to convert digital codes to analog reference values.

ADC 300 depicted in FIG. 3, which includes a switched capacitor integrator stage 360 between sample and hold stage 310 and comparator stage 318, offers significant benefits in comparison to other techniques and circuitry for performing low-power digitization of an analog sensor input value. For example, ADC 300 may tolerate large parasitic capacitances (represented by capacitor $C_p$ 332) in comparison to other SAR ADC circuits. In addition, ADC 300 overcomes parasitic-dependent conversion errors, offering improved robustness and insensitivity to parasitic capacitances in comparison with other ADCs.

Figure 4:
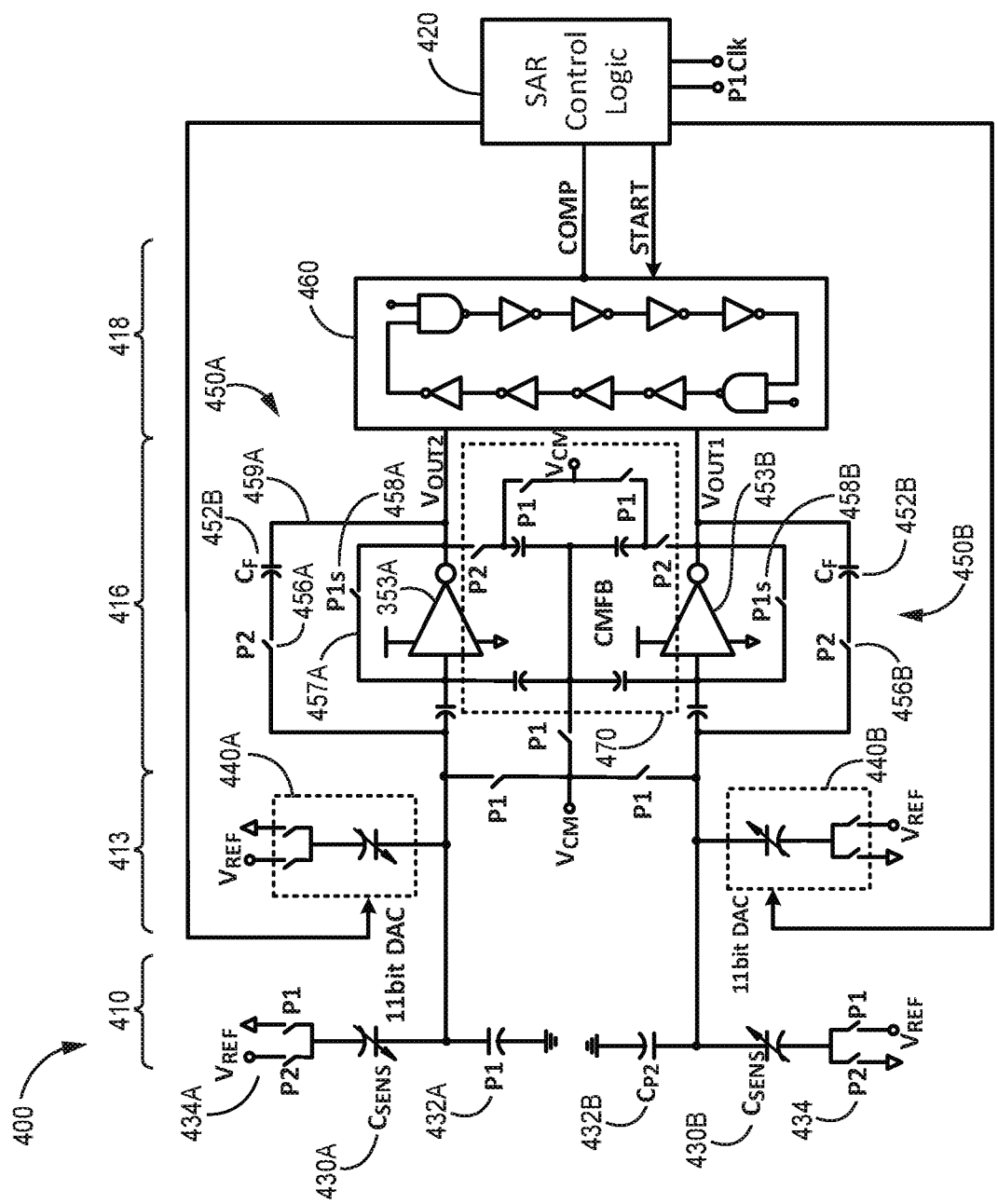
FIG. 4 is a circuit diagram illustrating one example of a differential SAR ADC consistent with one or more aspects of this disclosure.

FIG. 4 is a circuit diagram depicting one example of a differential SAR ADC 400 consistent with one or more aspects of this disclosure. Differential ADC 400 differs from ADC 300 depicted in FIG. 3 in that it is configured to receive and convert a differential analog input value into a digital output value. According to other aspects, ADC 400 offers robustness against common mode noise, noise coupling and errors due to such a differential implementation.

As shown in FIG. 4, ADC 400 includes a differential sample and hold stage 410 that includes a first sense capacitor 430A that receives a first portion of a differential input (positive input), and a second sense capacitor 430B that receives a second portion of the differential input (negative input). The terms positive and negative as described with respect to differential input herein refer to the respective portions of a differential input, and must not necessarily be positive or negative signals. In some examples, a differential input includes first and second inputs of the same polarity but at different voltage or current levels.

As shown in FIG. 4, ADC 400 includes a digital to analog converter (DAC) stage 413. The DAC stage 413 includes a first DAC 440A coupled to a sense capacitor 430A associated with a positive differential input of ADC 400, and a second DAC 440B coupled to sense capacitor 430B associated with a negative differential input of ADC 400.

In operation, DACs 430A and 430B are configured to receive digital codes and generate analog reference values for comparison with a sampled differential analog input value of ADC 400. As depicted, an output of each of DACs 440A and 440B are coupled to respective sense capacitors 430A, 430B of the respective positive and negative inputs of ADC 400. Accordingly, the analog reference value is combined (added or subtracted) with the sampled differential input value to create a combined value. In this manner, for each of the respective positive and negative differential inputs, a combined value representing a difference between the analog input value and the analog reference value is supplied to integrator stage 416.

Like DAC stage 413, integrator stage 416 includes a first integrator 450A and a second integrator 450B. Each of these respective integrators 450A, 450B is associated with one of the differential input capacitors 330A, 330B of ADC 400. As shown in FIG. 4, a combined value associated with the positive differential input is supplied to first integrator 450A, while a combined value associated with the negative differential input is supplied to the second integrator 450B.

In operation, first integrator 450A and second integrator 450B operate to integrate the respective combined values associated with the positive and negative differential inputs of ADC 400, and output the respective integrated combined values to comparator stage 460. Comparator stage 460 compares these respective outputs to one another to determine whether the differential input of ADC 400 is higher or lower than a reference value at the respective outputs of DACs 440A and 440B. An output of comparator stage 460 is used by controller 420 to set a bit of a digital output value of ADC 400.

As shown in FIG. 4, in some examples ADC 400 includes a common mode feedback CMFB circuit 470 coupled between first integrator 450A and second integrator 450B. CMFB circuit 470 is implemented to provide stable output common mode voltage to ADC 400. In operation, the switches of CMFB circuit 470 labeled P1 are closed during the sample phase P1, and the switch labeled P2 is open, thereby coupling an input of amplifiers 450A and 450B to $V_{cm}$, and decoupling the output of amplifiers 450A and 450B from $V_{cm}$. As also depicted in FIG. 4, during the conversion phase P2, the switches labeled P1 are open and the switches labeled P2 are closed, thereby decoupling the inputs and outputs of amplifiers 450A and 450B from $V_{cm}$. In this manner, CMFB circuit is implemented to provide the stable output common mode voltage.

Figure 5A:
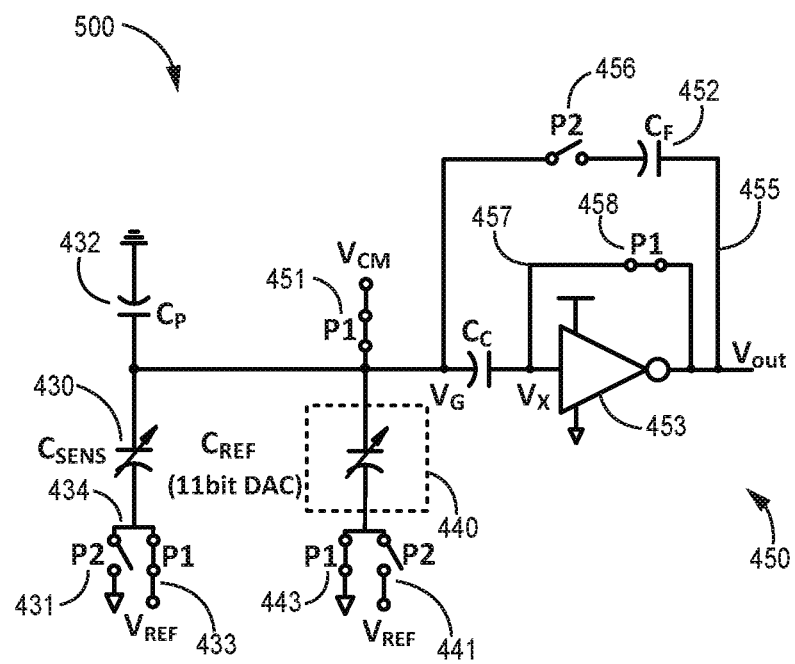
FIGS. 5A and 5B are circuit diagrams depicting a SAR ADC operating in different phases consistent with one or more aspects of this disclosure.
Figure 5B:
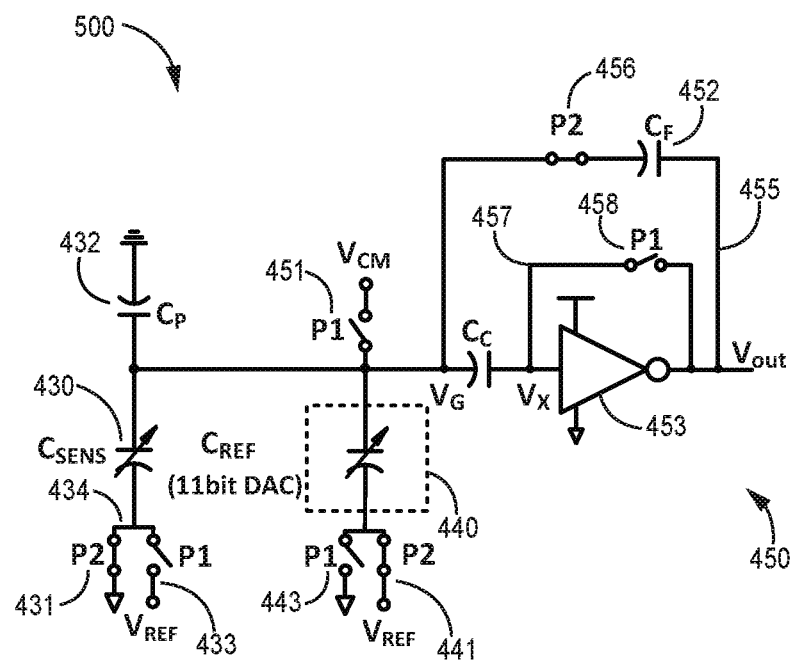

FIGS. 5A and 5B are circuit diagrams that illustrate operation of ADC 500, including integrator stage 416, during the respective sample (P1) and conversion (P2) phases of ADC 400. For explanatory purposes, FIGS. 5A and 5B depict only those portions of ADC 500 associated with the negative differential input of ADC 500 (i.e., associated with sense capacitor 430B depicted in FIG. 4). One of ordinary skill in the art will readily understand that the functionality described with respect to the negative differential input in FIGS. 5A and 5B are similarly applicable to the positive input, with reversed polarity.

FIG. 5A depicts one example of ADC 500 operation during a sample phase P1. During phase P1, integrator 450 is configured as a unity gain amplifier. For example, as shown in FIG. 1, switch 458 is closed, thereby enabling first feedback loop 457. As also shown in FIG. 5A, switch 456 is open, thereby disabling second feedback loop 455, removing feedback capacitor 452 from a feedback path of amplifier 453. As a unity gain amplifier, integrator 450 cancels the offset voltage of integrator 450, and reduces or eliminates flicker noise 1/f (i.e., auto-zeroing.).

As shown in FIG. 5A, integrator 450 includes an offset sampling capacitor $C_c$. The offset sampling capacitor Cc samples an offset associated with integrator 450 with respect to the common-mode voltage $V_{CM}$. As shown in FIG. 5A, during the sample phase P1, switch 451 is closed, coupling the node labelled $V_g$ at the input of integrator 450 to the common mode voltage $V_{cm}$. Coupling of node $V_g$ to $V_{cm}$ causes $V_{cm}$ to charge reference capacitor $C_{ref}$, sense capacitor $C_s$ 430, and parasitic capacitor $C_p$ 432.

As also shown in FIG. 5A, in the sample phase, switch 443 is closed (and switch 441 is open), coupling reference capacitor $C_{ref}$ of DAC 440 to ground. In the sample phase, switch 433 is closed (and switch 431 is open), coupling sense capacitor 430 to reference voltage $V_{ref}$.

FIG. 5B depicts one example of ADC 500 operation during a conversion phase P2. During phase P2, integrator 450 is configured as a charge amplifier. For example, as shown in FIG. 5B, switch 458 is open, thereby disabling first feedback loop 457. As also shown in FIG. 5A, switch 456 is closed, thereby enabling second feedback loop 455, adding feedback capacitor 452 to the feedback of amplifier 453. As configured in the conversion phase, a voltage $V_x$ at the input of the amplifier 453 holds the offset voltage associated with integrator 450 due to negative feedback. As depicted in FIG. 5B, in the conversion phase, a voltage at nodes $V_G$ is kept at $V_{CM}$.

In the conversion phase, as also shown in FIG. 5B, switch 443 is open (and switch 441 is closed), coupling reference capacitor $C_{ref}$ of DAC 440 to a reference voltage $V_{ref}$. In the conversion phase, switch 433 is open (and switch 431 is closed), coupling sense capacitor 430 to ground. As configured in the conversion phase, a net charge ($C_{sense}-C_{ref}$) of node $V_g$ is transferred onto feedback capacitor $C_f$.

According to the example of FIGS. 5A and 5B, an output voltage $V_{out}$ of amplifier 453 may be expressed as:

$$V_{OUT} = V_{CM} + \Delta V_O = V_{CM} + \frac{(C_{SENS} - C_{REF})V_{REF}}{C_F}, \quad (3)$$

where $\Delta V_O$ is the change in the output voltage.

Referring back to FIG. 4, which illustrated a differential ADC 400, a differential output of amplifier 453A may be referred to as $V_{out1}$, and the differential output of amplifier 453B may be referred to as $V_{out2}$. According to these examples, the differential output of inverter stage 416 can be expressed as:

$$\Delta V_{OUT} = V_{OUT1} - V_{OUT2} = 2\frac{(C_{SENS} - C_{REF})V_{REF}}{C_F} + V_{OS}. \quad (4)$$

Wherein $V_{os}$ is an offset voltage attributable to the comparator. According to the examples described above, comparator 460 receives $V_{out1}$ and $V_{out2}$, and determine whether $\Delta V_{out}$ is positive or negative. Comparator 460 provides the result to controller 420, which sets a bit of a digital value representing the analog differential input value based on the comparison.

ADC 400 is operative to digitize an analog input value to output a digital representation of the analog input value similar to a typical successive approximation register ADC, i.e., controller 420, via DAC stage 413, modifies a reference value $C_{ref}$ until it matches the input analog value ($C_{sense}$) within an error of less than 1 least significant bit (LSB) of a digital value representing the analog input value.

The minimum resolution of ADC 400 may be expressed as:

$$LSB = \frac{C_F V_{OS}}{2V_{REF}}. \quad (5)$$

As described above, $\Delta V_{out}$ for a typical SAR ADC may be expressed as:

$$\Delta V = 2V_{REF}\frac{(C_{SENS} - C_{REF})}{C_T} + V_{OS}. \quad (1)$$

Where $C_T$ is the total capacitance, i.e., $C_T=(C_{SENS}+C_{REF}+C_P)$. The resolution of such an ADC can be expressed as:

$$LSB = \frac{C_T V_{OS}}{2V_{REF}}. \quad (2)$$

As shown above, for a typical SAR ADC, both the output $\Delta V_{out}$ and the resolution LSB of the ADC are dependent on total capacitance, and thus the parasitic capacitance $C_p$. In comparison, the SAR ADC 400 described herein, dependence of the output $\Delta V_{out}$ and the resolution LSB on parasitic circuit capacitance is reduced and/or eliminated.

Figure 6A:
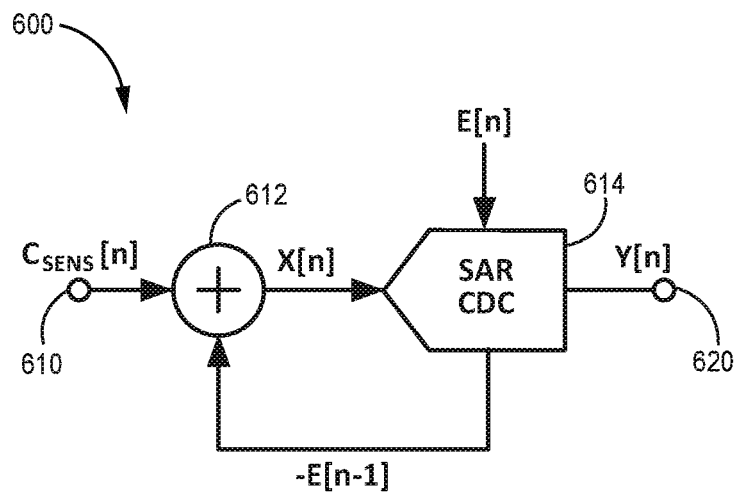
FIG. 6A is a conceptual diagram illustrating operation of a SAR ADC as described herein expressed as a Z-transform consistent with one or more aspects of this disclosure.
Figure 6B:
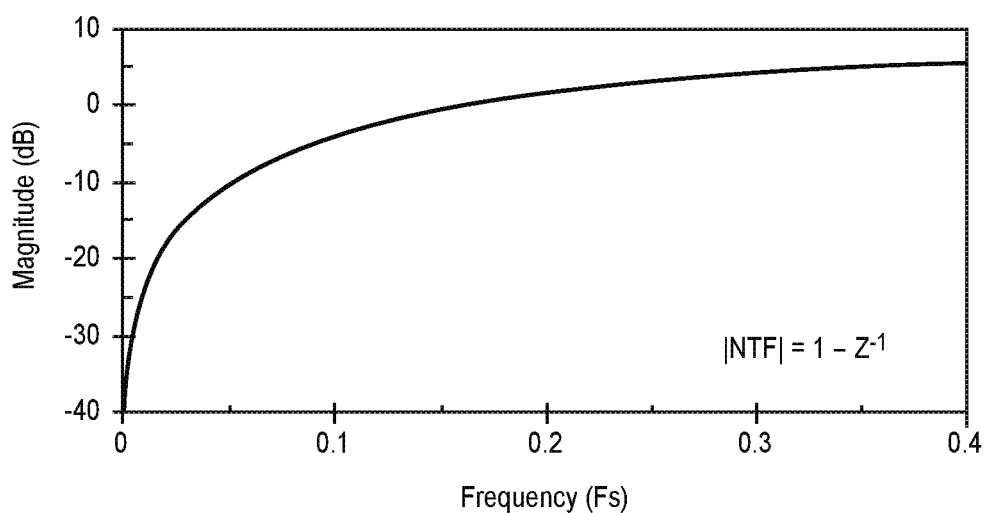
FIG. 6B is a graph depicting a plot of a noise transfer function of a SAR ADC as described herein.

FIG. 6A is a conceptual diagram that illustrates one example of a SAR ADC expressed as a Z-transform consistent with one or more aspects of this disclosure. In some examples, such as discussed above with respect to reset switch 354, when a conversion phase P2 of ADC 400 is complete (the N-bit has been set), residue information (which may be expressed as a voltage $V_{res}$), which is the difference between the input $C_{SENS}$ and digital output $D_{OUT}$ (at the end of a conversion from the SAR logic at the top plate of binary weighted DACs) is transferred to the output of the integrator 450. $V_{res}$ may be expressed by:

$$V_{RES} = 2\frac{C_{SENS}V_{REF}}{C_F} - D_{OUT} \leq 2\frac{LSB \cdot V_{REF}}{C_F}. \quad (6)$$

The integrator 450 may be "reset" according to one of two modes, whether at the end of each conversion phase, or based on a number of clock cycles. The reside voltage is stored at an output of integrator 450, and fed back to an input of ADC 400 (e.g., sampling capacitor(s) 430A and/or 430B) before the next conversion phase. According to these examples, a new input sample (a next conversion cycle) may be expressed as:

$$X[n]=C_{SENS}[n]+-E[n-1], \quad (7)$$

Where $-E[n-1]$ is $C_{SENS}[n-1]-C_{DAC}[n-1]$. Thus, the first-order noise transfer function is realized by combining the residue of the previous cycle and the input of current cycle. The output voltage of integrator 450 in Z transform may be expressed as:

$$\Delta V_{OUT}(z) = 2\frac{(C_{SENS}Z^{-1/2} - C_{REF})V_{REF}}{C_F}\frac{1}{[1-Z^{-1}]}. \quad (8)$$

In this manner, ADC 400 is configured to perform noise shaping with a noise transfer function [1−Z⁻¹]. FIG. 7B is a graph illustrating a plot of a noise transfer function of a SAR ADC as described herein.

In some examples, integrator 450 depicted in FIGS. 4 and 5A-5B may include an inverter-based operational transconductance amplifier (OTA). The OTA may be described as a "push-pull" inverter amplifier that provides high gain and high energy efficiency, as the NMOS and PMOS transistors contribute to transconductance for the same bias current. In some examples, energy efficiency and transconductance of the amplifier may be doubled in comparison to conventional amplifiers.

Referring back to FIG. 4, ADC 400 includes a comparator 460 that receives the respective outputs of integrators 450A and 450B, and outputs to controller 420 an indication of the comparison (whether $V_{out1}$ is greater than $V_{out2}$), which controller 420 uses to set respective bits of a digital output value. Although not depicted in FIG. 4, comparator 460 may comprise any electrical circuitry configured to compare two values, for example an operational amplifier or other type of comparator. As depicted in FIG. 4, comparator 460 may include a ring oscillator-based comparator. One example of a ring oscillator-based comparator 700 is depicted in FIG. 7. As depicted in FIG. 7, comparator 700 includes a first NAND gate 702A, a second NAND gate 702B, and a plurality of inverters 701A-701H arranged between the NAND gates 701A, 701B. As shown in FIG. 7, each of NAND gates 701A, 701B is configured to receive a start signal. As also shown in FIG. 7, each of inverters 701A-701H is alternately configured to receive a first or second input. For example, each of inverters 701A, 701C, 701E, 701G are configured to receive a first input ($V_p$), and inverters 701B, 701D, 701F, 701H are configured to receive a second input ($V_n$). Referring to the example of FIG. 4, $V_p$ may be coupled to an output ($V_{out1}$) of integrator amplifier 450A, and $V_n$ may be coupled to an output ($V_{out2}$) of integrator amplifier 450B.

Comparator 700 is configured to compare a value at input $V_n$ to a value at input $V_p$. In operation, when a start signal is asserted at the START inputs of NAND gates 702A, 702B, it causes two leading edges to be injected into the comparator 700. The edges travel at a rate relative to a voltage at the respective inputs $V_p$ and $V_n$. Comparator 700 performs a comparison of the respective inputs $V_p$ and $V_n$ based on which leading edge "overtakes" the other traveling around the ring oscillator. Once one of the leading edges overtakes the other, comparator 700 outputs an indication of which of the respective inputs $V_p$ and $V_n$ is greater.

Using a ring oscillator-based comparator 700 with the differential SAR ADC topology described herein may offer significant advantages. For example, because ring oscillator-based comparator uses less energy to perform coarse comparisons in contrast to other types of comparator circuitry, power consumption of ADC 400 may be significantly reduced.

Figure 7A:
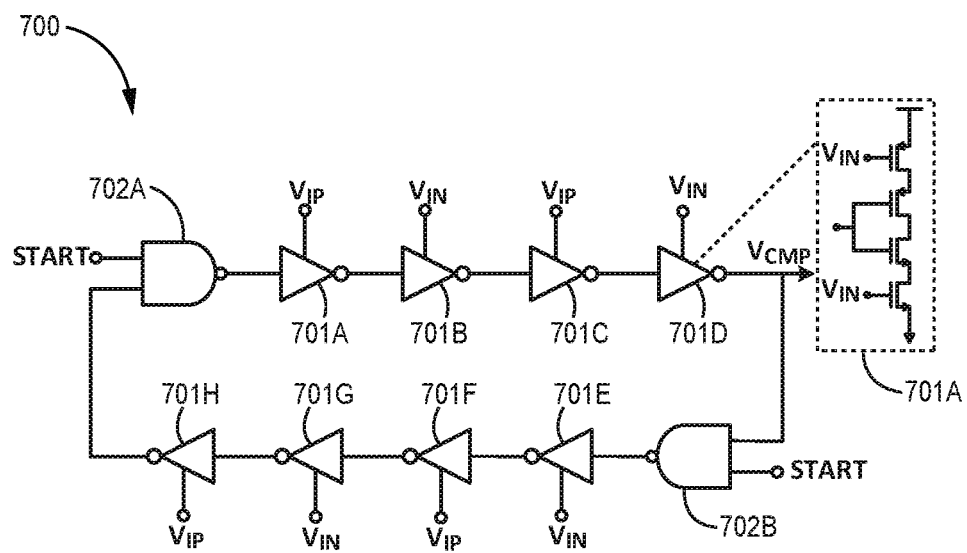
FIG. 7A is a circuit diagram depicting one example of a comparator that may be used in a SAR ADC consistent with one or more aspects of this disclosure.
Figure 7B:
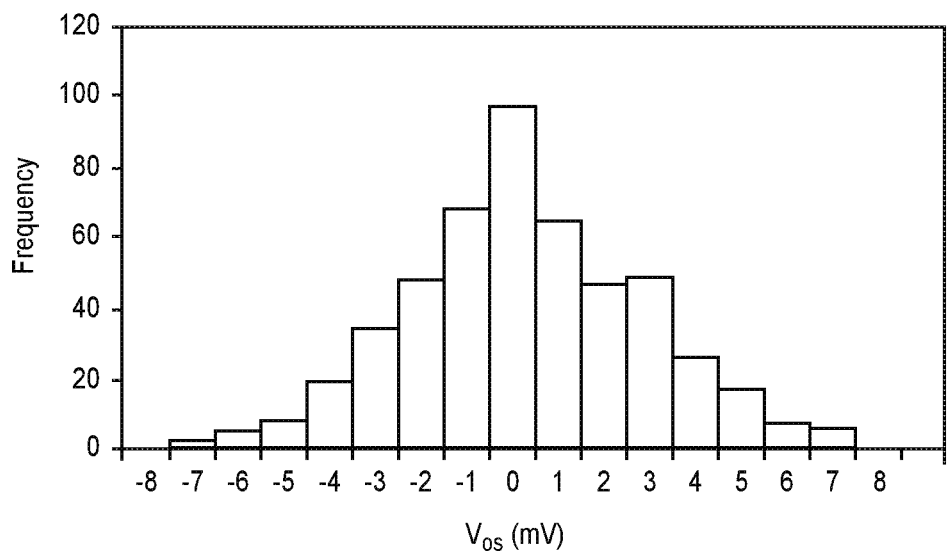
FIG. 7B is a graph that depicts a Monte Carlo simulation an offset voltage of a ring oscillator-based comparator consistent with one or more aspects of this disclosure.

FIG. 7B shows the energy consumption versus the input difference for the ring oscillator-based comparator 700 depicted in FIG. 7A. FIG. 7B shows that, for fine comparison (input difference is small), the energy consumed is relatively large because the number of cycles required to make a decision is increased. The mismatch in the delay cells creates an offset voltage that depends on the number of stages (i.e., a number of inverters). The offset voltage of the K-stage delay cells $V_{OS\_K}$ may be expressed by, $$V_{OS\_K} = \frac{1}{\sqrt{K}} V_{OS}. \tag{10}$$

Figure 7C:
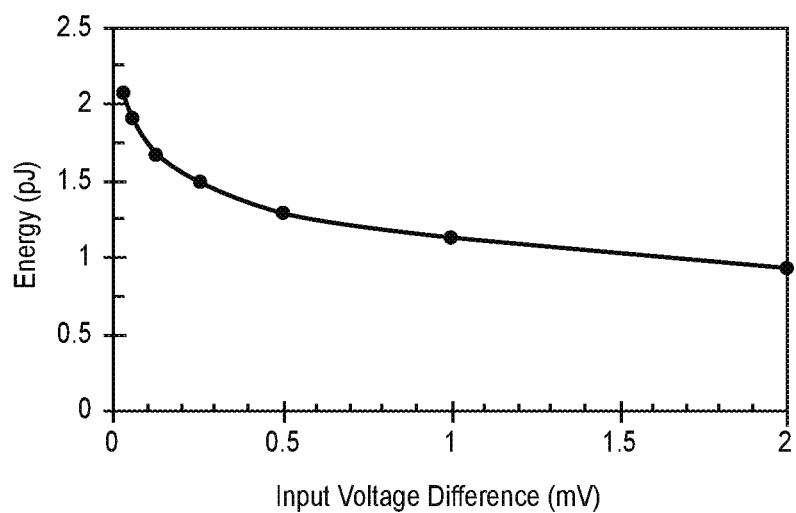
FIG. 7C is a graph depicting an energy of a comparator versus an input voltage difference consistent with one or more aspects of this disclosure.

FIG. 7B is a graph that depicts a Monte Carlo simulation (500 runs) of the offset voltage, where the rms offset voltage is 2.6 mV of the implemented comparator. FIG. 7C is a graph that depicts an energy of comparator 700 versus an input voltage difference of comparator 700.

Figure 8:
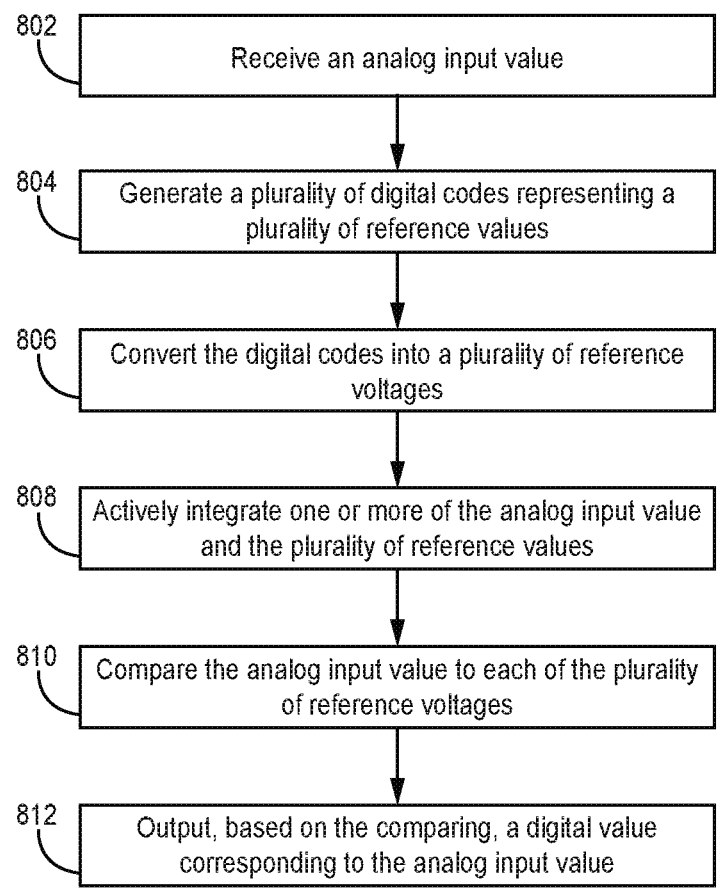
FIG. 8 is a flow diagram illustrating one example of a method of analog to digital conversion consistent with one or more aspects of this disclosure.

FIG. 8 is a flow diagram that depicts one example of a method of operating an analog to digital converter (ADC) consistent with one or more aspects of this disclosure. As depicted in FIG. 8, the method incudes receiving an analog input value (802). The analog input value may be a single ended input value, or a differential input value. As also depicted in FIG. 8, the method further includes generating a plurality of digital codes representing a plurality of reference values (804). As also show in FIG. 8, the method further includes converting the plurality of digital codes into a plurality of reference values (806). As also shown in FIG. 8, the method further includes actively integrating at least one of the analog input value and the reference values (808). In some examples, actively integrating may comprise using an integrator configured to function differently depending on a phase of the ADC 100. In some examples, actively integrating includes using an operational transconductance amplifier (OTA). In some examples, the OTA is an inverter-based OTA.

As also shown in FIG. 8, the method further includes comparing the analog input value to each of the reference values (810). In some examples, the comparison is performed by a ring oscillator-based comparator. As also shown in FIG. 8, the method further includes outputting, based on the comparison, a digital value that represents the analog input value.

Figure 9:
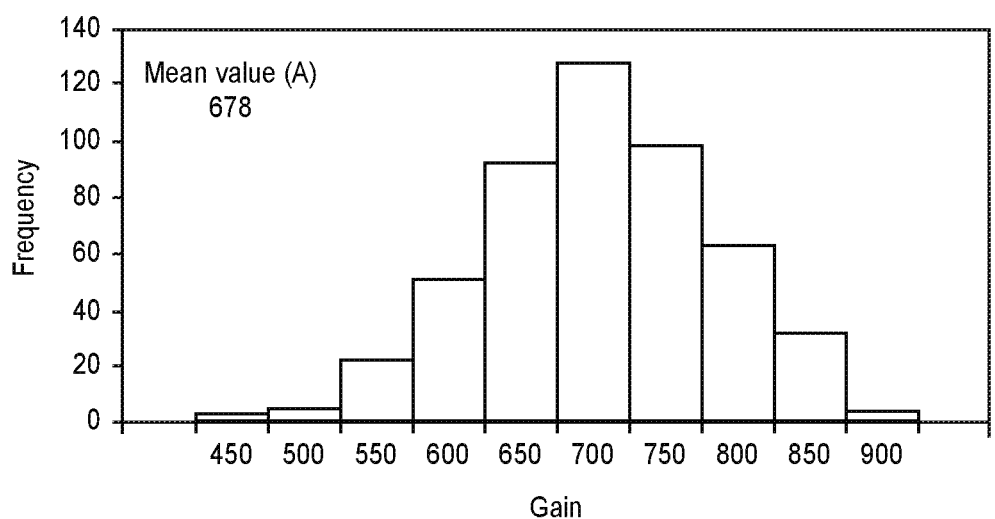
FIG. 9 is a graph that depicts a Monte Carlo simulation of the gain of an SAR ADC as described herein consistent with one or more aspects of this disclosure.
Figure 10:
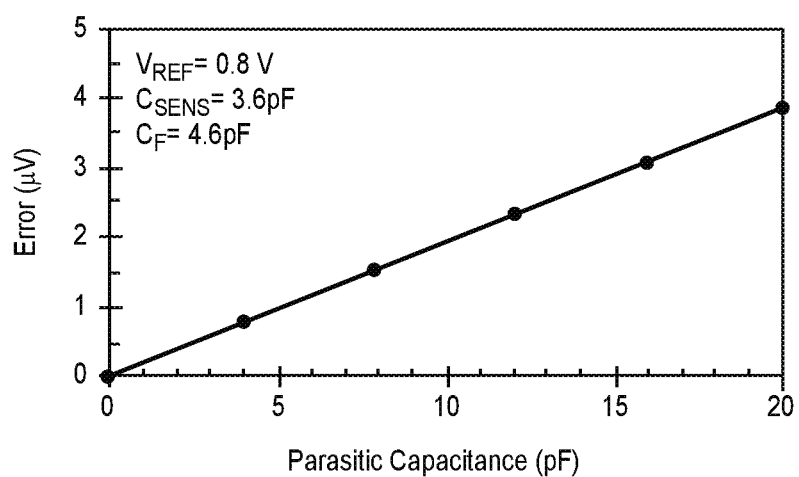
FIG. 10 is a graph depicting a maximum error in output voltage versus parasitic capacitance consistent with one or more aspects of this disclosure.

In some examples, where integrator 450 includes an OTA amplifier, the amplifier is biased at a subthreshold regime for better efficiency. In some examples, as described above, 1/f noise and an offset are canceled by adopting an auto-zeroing technique, and a common-mode feedback circuit (e.g., CMFB circuit 470 depicted in FIG. 4) is implemented to provide a stable common mode of amplifier 453. In addition, in differential implementations such as depicted in FIG. 4, ADC 400 is not susceptible to power supply or substrate noise. An accuracy of the charge transfer of ADC 400 is determined by the open loop DC-gain of amplifier 453. Therefore, when the open loop DC-gain is considered in the analysis, the output voltage of the amplifier may be expressed as:

$$\Delta V_{OUT} = 2 \frac{(C_{SENS} - C_{REF})V_{REF}}{C_F + \frac{C_T + C_F}{A}}, \tag{9}$$

Where A is the finite gain of the amplifier 453. In some examples, ADC 400 may be configured to tolerate relatively large parasitic capacitances (i.e., several tens of pF) by using an inverter of nominal DC-gain (e.g., 678) as an integrator. FIG. 9 depicts one example of a Monte Carlo simulation (500 runs) of the gain of ADC 400. FIG. 10 shows a maximum error in $\Delta V_{OUT}$ at full-scale input capacitance versus the parasitic capacitance of the SAR ADC described herein, which is negligible when compared to LSB voltage.

Referring back to FIG. 1, according to a SAR ADC 100 as described herein, a number of bits included in a digital output value of ADC 100 sets the dynamic range of the ADC. In addition a unit capacitor $C_{LSB}$ of the ADC sets the absolute resolution. In some examples, charge-redistribution DAC (e.g., of D/A converter stage 113) is implemented using one or more 11-bit binary-weighted capacitors. In some examples, a nonlinearity due to capacitor mismatch may limit the accuracy of the DAC. Therefore, the random mismatch affects the maximum achievable resolution for the given mismatch of the unit capacitor $C_{LSB}$. In some examples, a worst-case mismatch may occur at a mid-code transition when all the capacitors in the binary-weighted DAC are switched. The standard deviation at worst-case differential non-linearity (DNL) for differential implementation may be expressed as:

$$\sigma_{DNL} = \frac{1}{2\sqrt{2}}\sqrt{2(2^N - 1)}\,\sigma_u\left(\frac{\Delta C}{C}\right), \quad (11)$$

where $$\sigma_u\left(\frac{\Delta C}{C}\right)$$

is the standard deviation of the capacitor mismatch. According to one example, for a three-sigma yield of 99.73%, the unit capacitor may be selected such that $$3\sigma_{DNL} < \frac{1}{2}\text{LSB}. \quad (12)$$

In some examples, an ADC 100 as described herein may include custom-designed metal-oxide-metal (MOM) capacitor to implement the capacitive DACs. According to such examples, the MOM capacitor may be implemented in a metal 4 layer (M4) of an integrated circuit including the capacitive DACs to reduce any unintended parasitic capacitances from ground (e.g., the substrate). As a specific example, for a 0.18 μm CMOS technology, a unit area of 22.44 μm2 may be used to achieve a measured absolute resolution capacitor of 1.77 fF. In some examples, by using the mismatch models from the foundry, the three-sigma of the fringing capacitor mismatch is 1.4% for the given unit area. Therefore, the maximum achievable resolution is 11-bit for the three-sigma of the DNL error to be less than ½ LSB. In some examples, an 11-bit capacitive DAC is implemented and composed of 2047 unit elements, which achieve a 3.62 pF dynamic range. In some examples, a common-centroid approach is used to combine the elements and to reduce mismatch and layout non-idealities.

To test the SAR ADC 100 described herein, a prototype design was fabricated based on a 0.18 μm CMOS process. According to the prototype, the active area of the chip was 0.3 mm2, including cap DACs, analog, and digital circuitry. The prototype includes a serial peripheral interface (SPI) on-chip to communication with the chip, reading and writing control bits. A circuit board was designed and fabricated to experimentally characterize the CMOS chip.

Figure 11A:
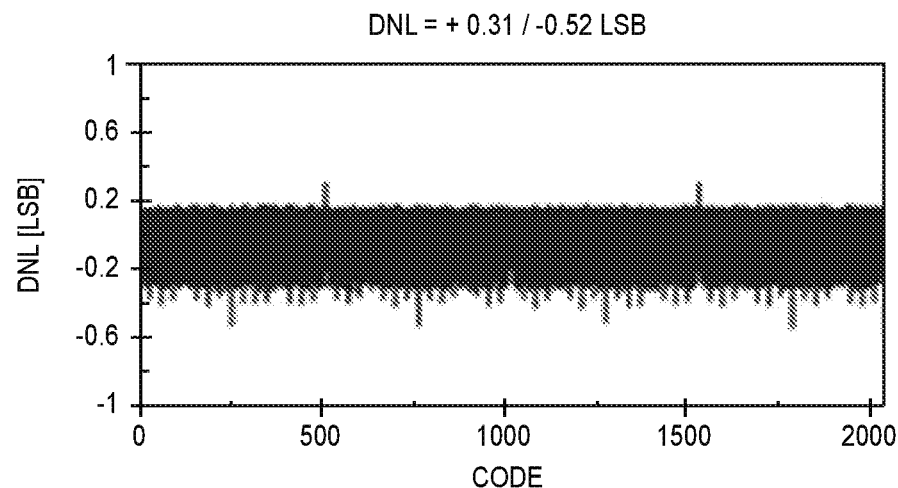
FIG. 11A is a graph that shows a measured integral non-linearity of capacitive DACS that may be used in a SAR ADC consistent with one or more aspects of this disclosure.
Figure 11B:
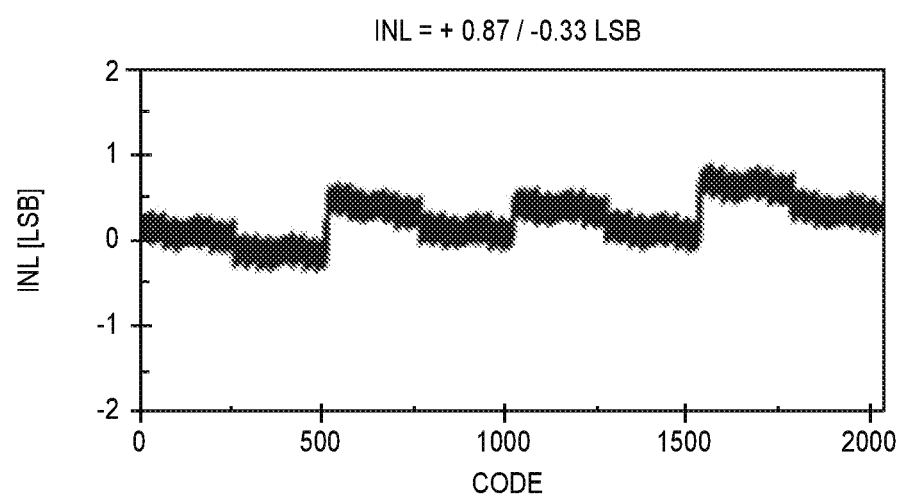
FIG. 11B is a graph that shows a differential non-linearity consistent with one or more aspects of this disclosure.

FIG. 11A is a graph that shows the measured integral non-linearity (INL) of the capacitive DACs, and FIG. 11B is a graph that shows a differential non-linearity (DNL), as measured using the above-described prototype. As seen in FIGS. 11A and 11B, a maximum DNL error is +0.31/−0.52 LSB, and a maximum INL error is +0.87/−0.33 LSB.

Figure 12A:
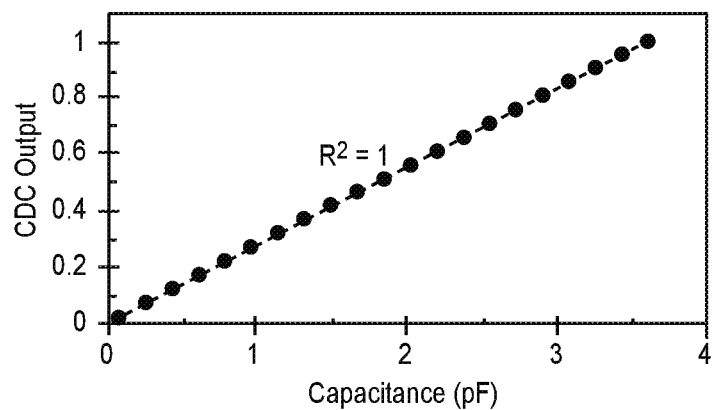
FIG. 12A is a graph that shows a dynamic range and linearity consistent with one or more aspects of this disclosure.
Figure 12B:
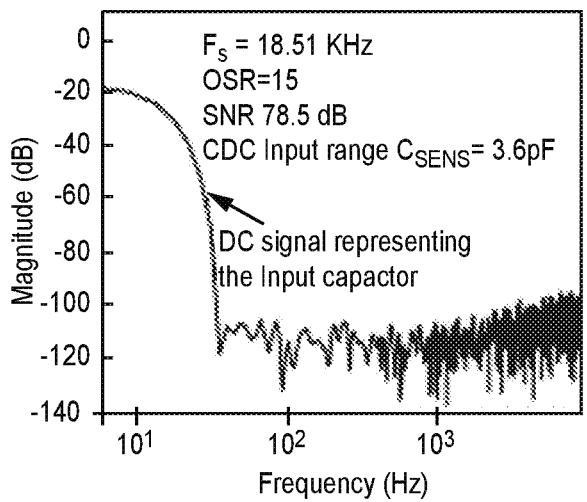
FIG. 12B is a graph that shows a measured output spectrum consistent with one or more aspects of this disclosure.

Using the above-described prototype, the instant inventors implemented dummy capacitive sensor on-chip to characterize the ADC 100. FIG. 12A is a graph diagram that shows the dynamic range and the linearity of ADC 100 when the input capacitance varies over its range. As shown in FIG. 12A, the measured LSB and dynamic range were 1.77 fF and 3.6 pF, respectively. FIG. 12B is a graph that shows the measured output spectrum of ADC 100, demonstrating noise shaping. As shown in FIG. 12B, at fs=18.51 KHz and OSR of 15, ADC 100 achieves 78.5 dB SNR with respect to its input capacitance range, which corresponds to a resolution of 150 aF. FIG. 12C is a graph that shows a measured signal to noise ratio (SNR) with different OSRs, and FIG. 12D is a graph that shows a measured figure of merit (FOM) with different OSRs. As shown in FIG. 12C, at less than 15 OSR, the circuit noise dominates the overall noise.

Figure 13:
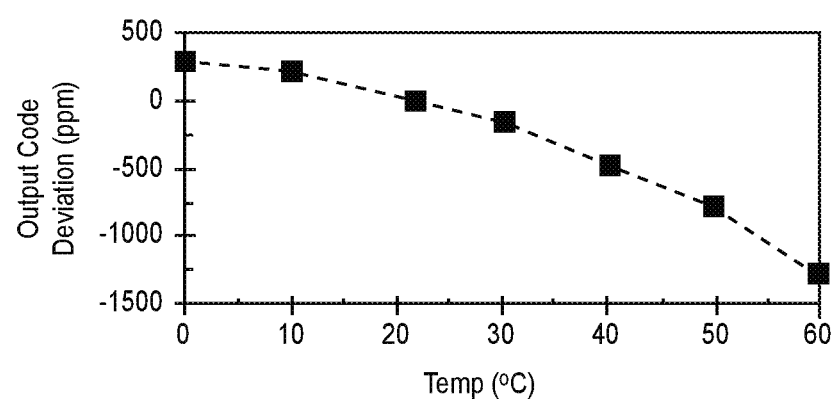
FIG. 13 is a graph that depicts an output variation due to temperature consistent with one or more aspects of this disclosure.

To demonstrate temperature sensitivity of ADC 100, ADC 100 was placed inside a temperature test chamber (espec SU-221). According to this test, a temperature range was swept from 0° C. to 60° C. to characterize conversion output variation. FIG. 13 is a graph that depicts the output variation of ADC 100 due to temperature. As shown in FIG. 13, over a temperature range of 0° C. to 60° C., the peak-to-peak deviation of the conversion output code was 1569.1 parts per million (ppm), which translates to a temperature sensitivity of 26.1 ppm/° C. As shown in FIG. 13, ADC 100 achieves low temperature sensitivity an order of magnitude better than other high-precision CDCs (resolution <1 fFrms).

Figure 14A:
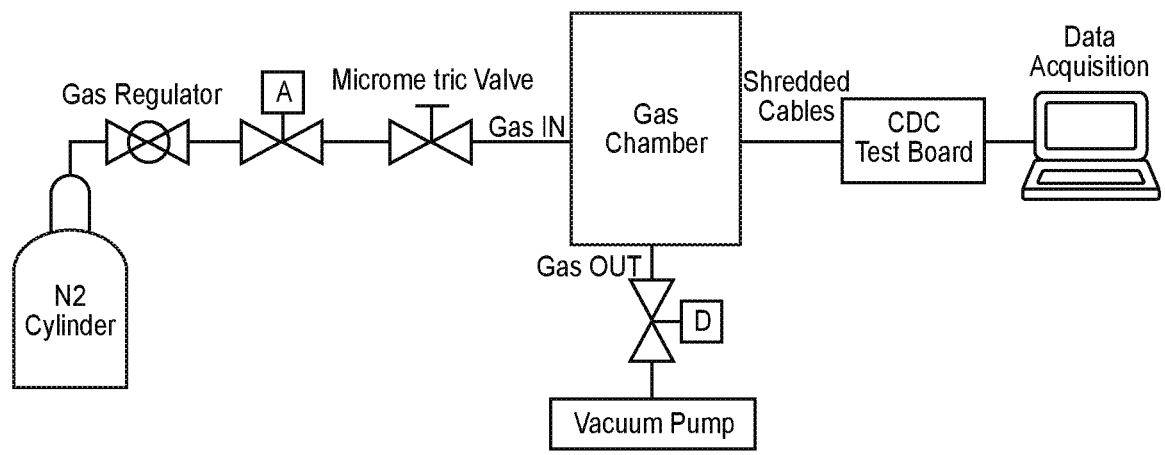
FIG. 14A is a system diagram that illustrates a pressure sensing test setup consistent with one or more aspects of this disclosure.

ADC 100 was also tested in a real pressure-sensing application. FIG. 14A is a system diagram that illustrates the utilized pressure-sensing test setup. According to this test, an off-chip MEMS capacitive pressure sensor is characterized by an Agilent E4980 LCR meter.

Figure 14B:
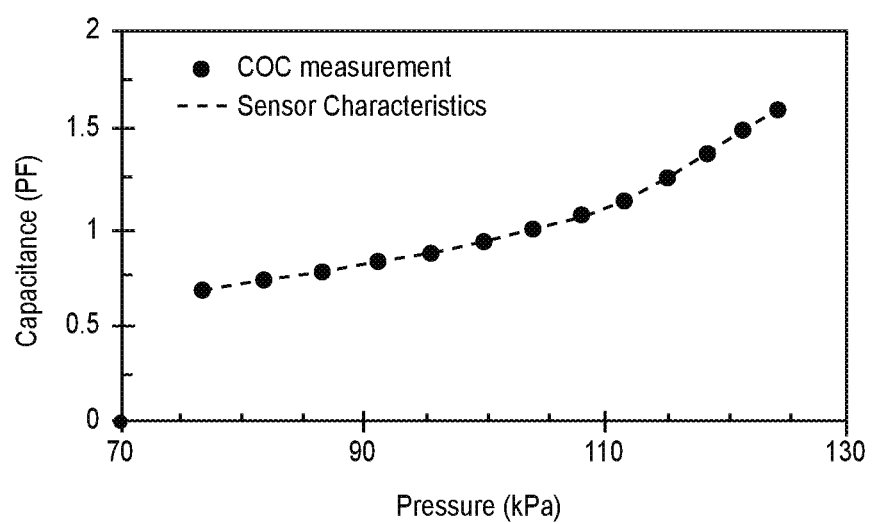
FIG. 14B is a graph that shows a measured ADC output in a low pressure mode consistent with one or more aspects of this disclosure.
Figure 14C:
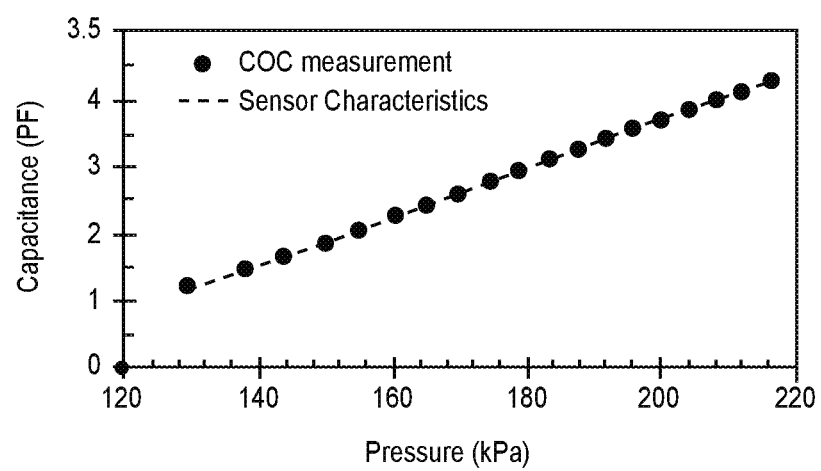
FIG. 14C is a graph that shows a measured ADC output in a high pressure mode consistent with one or more aspects of this disclosure.

According to this test, a baseline capacitance of the sensor was canceled by using a capacitor $C_{OFF}$ with a capacitance of 5 pF to fit the capacitance range of the CDC, i.e., C–5 pF. FIG. 14B is a graph that shows the measured ADC 100 output in a low-pressure mode, while FIG. 14C is a graph that shows the measured ADC 100 output in a high-pressure mode. As shown in FIGS. 14B and 14C, that the measured ADC 100 output follows the non-linear sensor characteristics in both low and high-pressure modes.

Figure 15C:
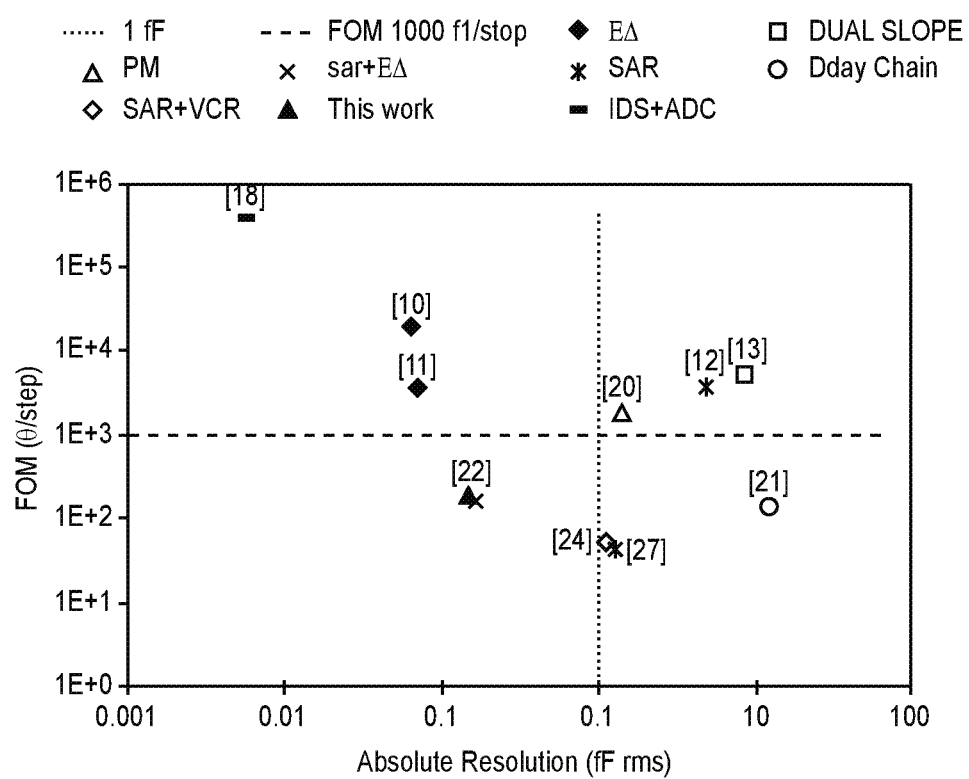
FIG. 15C is a graph that compares energy efficiency versus resolution of the SAR ADC described herein to other topologies for performing capacitance to digital conversion consistent with one or more aspects of this disclosure.

FIG. 15A is a table depicting a performance summary of a SAR ADC 100 as described herein. As show in the FIG. 15A table, at full-scale input capacitance, ADC 100 consumes a total power consumption of 1.59 μW with a sampling frequency of 18.51 KHz, where analog power is 1.02 μW, digital power is 0.39 μW and the reference power is 0.18 μW. The energy efficiency figure-of-merit (FoM) of in CDCs may be expressed as:

$$FOM = \frac{\text{Power} \times T_S}{2^{(SNR-1.76)/6.02}}, \quad (13)$$

where $T_S$ is the measurement time and SNR is the signal-to-noise ratio which may be expressed as:

$$SNR = 20\log\left(\frac{\text{Capacitance Range}/2\sqrt{2}}{\text{rms Capacitance Resolution}}\right). \quad (14)$$

FIG. 15B is a table depicting a comparison of the proposed SAR ADC 100 described herein with other CDC topologies. As shown in FIG. 15B, the differential ADC 400 described herein achieves a high energy efficiency FOM of 187 fJ/conversion-step and an absolute resolution (rms) of 150 aF. As shown in FIG. 15B, in comparison with other high-precision differential CDCs (absolute resolution<1 fFrms), the achieved FOM of ADC 100 exhibits an FOM 20 times better. ADC 100 consumes less power and area than even a single-ended SAR+ΔΣ CDC. Compared to a hybrid SAR+ voltage controlled oscillator (VCO), and other SAR CDCs, the ADC 100 described herein achieves 7.3 times better capacitive resolution. FIG. 15 is a graph that compares energy efficiency versus the absolute resolution of ADC 100 (400) described herein against other CDC topologies.

An improved capacitance to digital converter (CDC) that includes a SAR ADC 100 is described herein. The SAR ADC 100 provides for high resolution and energy efficiency in comparison with other topologies and techniques for capacitance to digital conversion. The described SAR ADC 100 includes an integrator-based inverter that performs noise shaping and is configured to operate in light of large parasitic capacitances. In addition, the SAR ADC 100 in some examples includes a ring-oscillator based comparator that uses energy scaling to provide needed comparison with high energy efficiency relative to other comparators. In addition, the SAR ADC 100 described herein utilizes an auto-zeroing scheme, and a common mode feedback circuit to eliminate an effect of an offset voltage and provide for a stable common mode voltage.

The SAR ADC 100 described herein may provide significant benefits in comparison with other circuits/techniques for performing capacitance to digital conversion (CDC). For example, experimental results show SAR ADC 100 achieves at 15 OSR a 12.74 ENOB, 150 aF and consumes only 1.59 µW total power, and low temperature sensitivity of 26.1 ppm/° C., without the need for calibration.

What is claimed is:

1. A successive-approximation register (SAR) analog to digital converter (ADC), comprising:
    a sample and hold stage comprising at least one sense capacitor and configured to receive a differential analog input value;
    a SAR controller that sequentially generates a plurality of digital codes representing a plurality of reference values;
    a digital to analog converter (DAC) stage that converts the plurality of digital codes into a plurality of analog reference voltages representing the plurality of reference values, the DAC stage comprising at least one reference capacitor;
    a comparator stage that compares the input value to the plurality of reference voltages; and
    an active integrator stage coupled between the sample and hold stage and the comparator stage, wherein the SAR controller is configured to operate the active integrator stage in a first phase and a second phase, wherein in the first phase a first feedback loop is enabled via a first switch to operate the OTA as a unity-gain amplifier and wherein a second switch is opened to disconnect an output of the OTA from an input to the comparator stage, wherein in the second phase a second feedback loop including a feedback capacitor is enabled via opening of the first switch and closing of the second switch and a third switch to operate the OTA as a charge amplifier, wherein a reset switch located in parallel across the feedback capacitor is selectively opened and closed during the second stage to provide residue information of a previous cycle;
    wherein the SAR controller generates a digital value corresponding to the analog input value based on an output of the comparator.

2. The SAR ADC of claim 1, wherein the comparator stage comprises a ring oscillator-based comparator.

3. The SAR ADC of claim 1, wherein the sample and hold stage receives a differential input comprising a positive input and a negative input of the analog input value;
    wherein the digital to analog converter stage comprises a first digital to analog controller (DAC) associated with the positive input and a second DAC associated with the negative input; and
    wherein the integrator stage comprises a first integrator that integrates the positive input and a second integrator that integrates the negative input.

4. The SAR ADC of claim 3, wherein the first DAC associated with the positive input converts a plurality of first reference voltages associated with the positive input, and wherein the second DAC associated with the negative input converts a plurality of second reference voltages associated with the negative input; and
    wherein the first integrator integrates the positive input and the plurality of first reference voltages, and wherein the second integrator integrates the negative input and the plurality of second reference voltages.

5. The SAR ADC of claim 3, further comprising:
    a common mode feedback (CMFB) circuit coupled between the first integrator and the second integrator.

6. A method of converting an analog sensor signal to a digital value, comprising:
    receiving an analog input value;
    sequentially generating a plurality of digital codes representing a plurality of reference values;
    converting the plurality of digital codes into a plurality of reference voltages representing the plurality of reference values;
    actively integrating one or more of the analog input value and the plurality of reference voltages using one or more operation transconductance amplifier (OTA), wherein actively integrating one or more of the analog input values and the plurality of reference voltages includes operating in a first phase and a second phase, wherein in the first phase a first feedback loop is enabled via a first switch to operate as a unity-gain amplifier and wherein a second switch is opened to disconnect an output of the OTA from an input to the comparator stage, wherein in the second phase a second feedback loop including a feedback capacitor is enabled via opening of the first switch and closing of the second switch and a third switch to operate the OTA as a charge amplifier, wherein a reset switch located in parallel across the feedback capacitor is selectively opened and closed during the second stage to provide residue information of a previous cycle;
    comparing the analog input value to each of the plurality of reference voltages; and
    generating, based on the comparing, a digital value corresponding to the analog input value.

7. The method of claim 6, wherein comparing the analog input value to each of the plurality of reference voltages comprises using a ring oscillator-based comparator.

8. The method of claim 6, further comprising:
    receiving, as the analog input value, a differential signal comprising a positive input and a negative input;
    sequentially generating a first plurality of digital codes associated with the positive input and a second plurality of digital codes associated with the negative input;

converting the first plurality of digital codes into a first plurality of reference values and the second plurality of digital codes into a second plurality of reference values;

actively integrating one or more of the positive input and a negative input, and the first plurality of reference values and the second plurality of reference values;

comparing the positive input and the first plurality of reference values to the negative input and the second plurality of reference values; and generating, based on the comparing, the digital value corresponding to the analog input value.

9. The method of claim 8, wherein integrating the positive input and the first plurality of reference values comprises using a first integrator, and wherein integrating the negative input and the second plurality of reference values comprises using a second integrator.

10. The method of claim 9, further comprising:
providing a stable common mode reference voltage using a common mode feedback (CMFB) circuit coupled between the first integrator and the second integrator.

11. A successive-approximation register (SAR) analog to digital converter (ADC), comprising:
means for receiving an analog input value;
a SAR controller that sequentially generates a plurality of digital codes representing a plurality of reference values;
means for converting the plurality of digital codes into a plurality of reference voltages representing the plurality of reference values;
means for actively integrating one or more of the analog input value and the plurality of reference voltages, wherein the means for actively integrating includes an amplifier configured to operate as a unity gain amplifier during a first phase in which a first feedback loop is enabled and as a charge amplifier during a second phase in which a second feedback loop including a feedback capacitor is enabled, wherein the means for actively integrating further includes a reset switch located in parallel across the feedback capacitor, wherein the reset switch is selectively opened and closed to provide noise shaping;
means for comparing the analog input value to each of the plurality of reference voltages; and
wherein the SAR controller generates a digital value corresponding to the analog input value based on an output of the comparator.

12. The SAR ADC of claim 11, wherein the means for actively integrating comprises at least one operational transconductance amplifier (OTA), and wherein the means for comparing comprise a ring oscillator-based comparator.

13. The SAR ADC of claim 1, wherein the OTA is reset for every conversion by selectively closing the reset switch.

14. The SAR ADC of claim 1, wherein the OTA is reset based on a number of cycles by selectively closing the reset switch after a selected number of cycles.

15. The SAR ADC of claim 1, wherein the OTA is reset using an oversampling ratio (OSR) to accumulate error, wherein the OTA is reset by selectively closing the reset switch.

16. The method of claim 6, wherein the wherein the OTA is reset for every conversion by selectively closing the reset switch.

17. The method of claim 6, wherein the OTA is reset based on a number of cycles by selectively closing the reset switch after a selected number of cycles.

18. The method of claim 6, wherein the OTA is reset using an oversampling ratio (OSR) to accumulate error, wherein the OTA is reset by selectively closing the reset switch.

19. The SAR ADC of claim 11, wherein the OTA is reset for every conversion by selectively closing the reset switch.

20. The SAR ADC of claim 11, wherein the OTA is reset based on a number of cycles by selectively closing the reset switch after a selected number of cycles.

* * * * *